US012628465B2

(12) United States Patent
Ikeda et al.

(10) Patent No.: US 12,628,465 B2
(45) Date of Patent: May 12, 2026

(54) METHOD FOR MANUFACTURING INORGANIC LIGHT EMITTER

(71) Applicant: Magnolia White Corporation, Tokyo (JP)

(72) Inventors: Masanobu Ikeda, Tokyo (JP); Yasuhiro Kanaya, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 1037 days.

(21) Appl. No.: 17/484,633

(22) Filed: Sep. 24, 2021

(65) Prior Publication Data

US 2022/0013684 A1     Jan. 13, 2022

Related U.S. Application Data

(63) Continuation of application No. PCT/JP2020/013919, filed on Mar. 27, 2020.

(30) Foreign Application Priority Data

Mar. 29, 2019     (JP) ................................. 2019-068912

(51) Int. Cl.
*H10H 20/01*        (2025.01)
*H10H 20/83*        (2025.01)
(Continued)

(52) U.S. Cl.
CPC ............ *H10H 20/01* (2025.01); *H10H 20/83* (2025.01); *H10H 20/84* (2025.01);
(Continued)

(58) Field of Classification Search
CPC ..... H01L 33/0093; H01L 33/40; H01L 33/42; H01L 25/075–0756; H01L 25/167;
(Continued)

(56) References Cited

U.S. PATENT DOCUMENTS 6,576,536 B1 *    6/2003    Babcock ........... H01L 21/76838
                                                        257/E21.582
6,740,604 B2     5/2004    Kelly et al.
(Continued)

FOREIGN PATENT DOCUMENTS

CN        1536616 A      10/2004
CN        107808913 A  *  3/2018    ............. H10H 20/84
JP        4285776         6/2009

OTHER PUBLICATIONS

English language translation of CN-107808913-A (Year: 2017).*
(Continued)

*Primary Examiner* — Yu Chen
(74) *Attorney, Agent, or Firm* — K&L Gates LLP

(57)        ABSTRACT

A method for manufacturing an inorganic light emitter, include arranging an inorganic light emitting element on one surface of a substrate; separating the inorganic light emitting element from the substrate while forming an oxide layer on a first surface of the inorganic light emitting element by emitting laser light to the first surface under an atmosphere having an oxygen concentration higher than an oxygen concentration of air, the first surface contacting the one surface of the substrate; and stacking the inorganic light emitting element separated at the separating on an array substrate to manufacture the inorganic light emitter.

13 Claims, 16 Drawing Sheets

(51) Int. Cl.
     *H10H 20/84*          (2025.01)
     *H10H 29/14*          (2025.01)

(52) U.S. Cl.
     CPC ......... *H10H 29/142* (2025.01); *H10H 20/032*
             (2025.01); *H10H 20/034* (2025.01)

(58) Field of Classification Search
     CPC ... H01L 21/6835; H01L 21/7806–7813; H01L
                 2221/68363; H01L 2221/68368; H01L
                                 2221/68381–68386
     See application file for complete search history.

(56)                  References Cited

U.S. PATENT DOCUMENTS

| | | | |
|---|---|---|---|
| 6,974,758 | B2 | 12/2005 | Kelly et al. |
| 7,713,840 | B2 | 5/2010 | Kelly et al. |
| 9,666,677 | B1 * | 5/2017 | Raring ................. H01L 29/402 |
| 2004/0241934 | A1 | 12/2004 | Inoue |
| 2005/0087743 | A1 | 4/2005 | Ogihara et al. |

| | | | |
|---|---|---|---|
| 2010/0032701 | A1 * | 2/2010 | Fudeta ................. H10H 20/841 |
| | | | 438/31 |
| 2011/0220942 | A1 * | 9/2011 | Choi ....................... H01L 33/32 |
| | | | 257/E33.07 |
| 2013/0234192 | A1 * | 9/2013 | Kim ................... H10H 20/8314 |
| | | | 257/98 |
| 2015/0041836 | A1 | 2/2015 | Saito et al. |
| 2017/0236811 | A1 | 8/2017 | Pokhriyal et al. |
| 2017/0373046 | A1 * | 12/2017 | Gardner ............. H01L 21/6835 |
| 2018/0114878 | A1 * | 4/2018 | Danesh ................. H10H 20/01 |
| 2018/0138372 | A1 * | 5/2018 | Kim ................... H10H 20/8316 |
| 2019/0096864 | A1 | 3/2019 | Huitema et al. |
| 2019/0131503 | A1 * | 5/2019 | Yahata ................. H10H 20/833 |

OTHER PUBLICATIONS

Chinese Office Action dated Apr. 27, 2024 in corresponding Chinese
patent application No. 202080024767.1 (12 pages).
International Search Report issued in Application No. PCT/JP2020/
013919, mailed Jun. 23, 2020.

* cited by examiner

FIG.2

Pix 100 (100G)

METHOD FOR MANUFACTURING INORGANIC LIGHT EMITTER

CROSS-REFERENCE TO RELATED APPLICATION

This application claims the benefit of priority from Japanese Patent Application No. 2019-068912 filed on Mar. 29, 2019 and International Patent Application No. PCT/JP2020/013919 filed on Mar. 27, 2020, the entire contents of which are incorporated herein by reference.

BACKGROUND

1. Technical Field

What is disclosed herein relates to a method for manufacturing an inorganic light emitter.

2. Description of the Related Art

In recent years, inorganic EL displays using, as display elements, inorganic light emitting diodes (micro LEDs), that is, inorganic light emitting elements have attracted attentions. The inorganic EL displays have the configuration in which the light emitting elements outputting light in different colors are arrayed on an array substrate. The inorganic EL displays use self-light emitting elements, thereby eliminating the necessity of a light source, and output light through no color filter, thereby achieving high light usage efficiency. The inorganic EL displays are excellent in environment resistance in comparison with organic EL displays using organic light emitting diodes (OLEDs) as the display elements.

Each inorganic light emitting element is formed on a formation substrate and is separated from the formation substrate by emitting laser light to the inorganic light emitting element on the formation substrate in some cases (for example, see Japanese Patent No. 4285776). The inorganic light emitting element separated from the formation substrate is stacked on the array substrate to manufacture an inorganic light emitter.

When the inorganic light emitting element is excessively irradiated with laser light, there is a risk that the inorganic light emitting element is deteriorated and performance such as light emitting efficiency is lowered. Accordingly, prevention of deterioration in the performance is desired when the inorganic light emitting element is separated from the substrate to manufacture the inorganic light emitter.

The present disclose has been made in view of the above-mentioned problem, and an object thereof is to provide a method for manufacturing an inorganic light emitter preventing deterioration in performance.

SUMMARY

According to an aspect, a method for manufacturing an inorganic light emitter includes arranging an inorganic light emitting element on one surface of a substrate; separating the inorganic light emitting element from the substrate while forming an oxide layer on a first surface of the inorganic light emitting element by emitting laser light to the first surface under an atmosphere having an oxygen concentration higher than an oxygen concentration of air, the first surface contacting the one surface of the substrate; and stacking the inorganic light emitting element separated at the separating on an array substrate to manufacture the inorganic light emitter.

BRIEF DESCRIPTION OF THE DRAWINGS

FIG. 2 is a plan view illustrating a plurality of pixels;

FIG. 8 is a view illustrating a light emitter in another example of the first embodiment;

FIG. 11 is a view for explaining a lamination method of the light emitter according to the second embodiment;

FIG. 12 is a view illustrating a light emitter in another example of the second embodiment;

FIG. 13 is a view for explaining a lamination method of the light emitter in another example of the second embodiment;

FIG. 16 is a view for explaining a lamination method of the light emitter in another example of the third embodiment.

DETAILED DESCRIPTION

Figure 1:
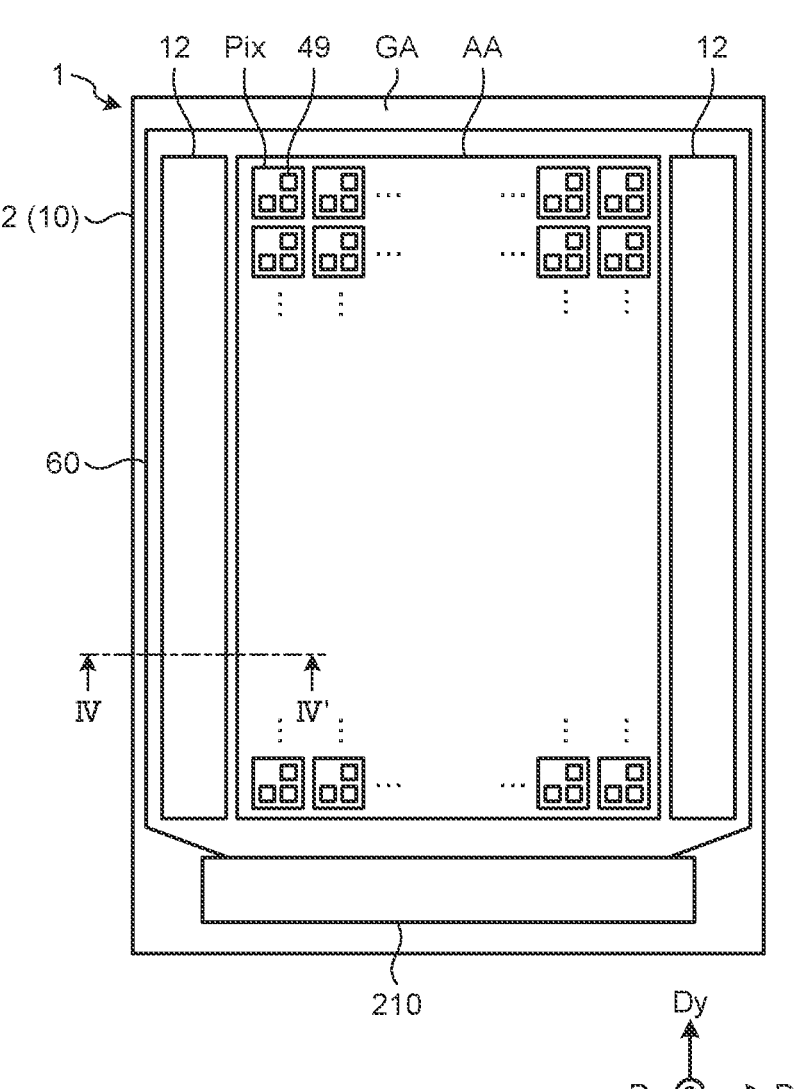
FIG. 1 is a plan view illustrating an example of the configuration of a display device according to a first embodiment.

Hereinafter, embodiments of the present disclose will be described with reference to the drawings. What is disclosed herein is merely an example, and it is needless to say that appropriate modifications within the gist of the disclose at which those skilled in the art can easily arrive are encompassed in the range of the present disclose. In the drawings, widths, thicknesses, shapes, and the like of the components are schematically illustrated in some cases for clearer explanation in comparison with actual modes. They are, however, merely examples and do not limit interpretation of the present disclose. In the present specification and the drawings, the same reference signs denote components identical to those described before with reference to the drawing that has been already referred, and detail explanation thereof can be appropriately omitted.

First Embodiment

FIG. 1 is a plan view illustrating an example of the configuration of a display device according to a first embodiment. As illustrated in FIG. 1, a display device 1 as a light emitting device includes an array substrate 2, pixels Pix, drive circuits 12, a drive integrated circuit (IC) 210, and cathode wiring 60. The array substrate 2 is a drive circuit substrate for driving the pixels Pix and is also referred to as a backplane or an active matrix substrate. The array substrate 2 includes a substrate 10, a plurality of transistors, a plurality of capacitors, and various types of wiring.

As illustrated in FIG. 1, the display device 1 has a display region AA and a peripheral region GA. The display region AA is a region in which the pixels Pix are arranged and images are displayed. The peripheral region GA is a region that does not overlap with the pixels Pix and is arranged on the outer side of the display region AA.

The pixels Pix are arrayed in a first direction Dx and a second direction Dy in the display region AA of the substrate 10. The first direction Dx and the second direction Dy are parallel with a first surface 10a (see FIG. 4) of the substrate 10 of the array substrate 2. The first direction Dx is orthogonal to the second direction Dy. The first direction Dx, however, need not be orthogonal to but may intersect with the second direction Dy. A third direction Dz is orthogonal to the first direction Dx and the second direction Dy. The third direction Dz corresponds to the normal direction of the substrate 10, for example. Hereinafter, "plan view" indicates a positional relation when seen from the third direction Dz.

The drive circuits 12 are provided in the peripheral region GA of the substrate 10. The drive circuits 12 drive a plurality of gate lines (for example, light emission control scan lines BG, reset control scan lines RG, initialization control scan lines IG, and writing control scan lines SG (see FIG. 3)) on the basis of various control signals from the drive IC 210. The drive circuits 12 select the gate lines sequentially or simultaneously and supply gate drive signals to the selected gate lines. The drive circuits 12 thereby select the pixels Pix coupled to the gate lines.

The drive IC 210 controls display of the display device 1. The drive IC 210 may be mounted as a chip on glass (COG) in the peripheral region GA of the substrate 10. A mounting manner of the drive IC 210 is not limited thereto, and it may be mounted as a chip on film (COF) on a wiring substrate coupled to the peripheral region GA of the substrate 10. The wiring substrate that is coupled to the substrate 10 is, for example, a flexible printed substrate and a rigid substrate.

The cathode wiring 60 is provided in the peripheral region GA of the substrate 10. The cathode wiring 60 is provided so as to surround the pixels Pix in the display region AA and the drive circuits 12 in the peripheral region GA. Cathodes (cathode electrodes 114 (see FIG. 5)) of a plurality of light emitting bodies 100 (see FIG. 4) are coupled to the common cathode wiring 60, and a fixed potential (for example, a ground potential) is supplied thereto. To be more specific, the cathode electrodes 114 of the light emitting bodies 100 are coupled to the cathode wiring 60 via a counter cathode electrode 90e above the array substrate 2. The cathode wiring 14 may have a slit in a part thereof and be formed by two different wiring lines above the substrate 10.

Figure 2:
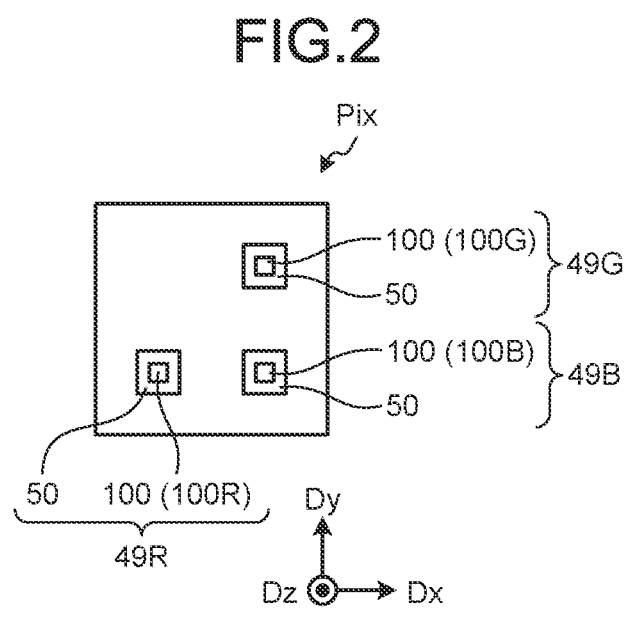

FIG. 2 is a plan view illustrating the pixels. As illustrated in FIG. 2, one pixel Pix includes a plurality of pixels 49. For example, the pixel Pix includes a first pixel 49R, a second pixel 49G, and a third pixel 49B. The first pixel 49R displays red of a primary color as a first color. The second pixel 49G displays green of a primary color as a second color. The third pixel 49B displays blue of a primary color as a third color. As illustrated in FIG. 2, the first pixel 49R and the third pixel 49B are aligned in the first direction Dx in one pixel Pix. The second pixel 49G and the third pixel 49B are aligned in the second direction Dy. The first color, the second color, and the third color are not limited to red, green, and blue, respectively, and desired colors such as complementary colors can be selected therefor. Hereinafter, when the first pixel 49R, the second pixel 49G, and the third pixel 49B need not to be distinguished from one another, they are referred to as pixels 49. The pixels 49 included in one pixel Pix are not limited to three, and equal to or more than four pixels 49 may correspond to one pixel Pix. For example, one pixel Pix may include a fourth pixel 49W in which white corresponds to a fourth color. Arrangement of the pixels 49 is not limited to the configuration illustrated in FIG. 2. For example, the first pixel 49R may be adjacent to the second pixel 49G in the first direction Dx. The first pixels 49R, the second pixels 49G, and the third pixels 49 may be repeatedly aligned in this order in the first direction Dx.

Each pixel 49 has the light emitter 100. The display device 1 outputs light components differing among the light emitting bodies 100 in the first pixels 49R, the second pixels 49G, and the third pixels 49B to display an image. The light emitting bodies 100 are inorganic light emitting diode (LED) chips each having a size of several μm to about 300 μm in plan view. In general, an LED having one chip size of equal to or more than 100 μm is referred to as a mini LED, and an LED having a size of less than 100 μm to several μm is referred to as a micro LED. In the disclose, LEDs having a desired size can be used and may be used depending on a screen size (size of one pixel) of the display device. The display device including the micro LEDs for the respective pixels is also referred to as a micro LED display device. The micro of the micro LEDs does not limit the size of the light emitting bodies 100.

Figure 3:
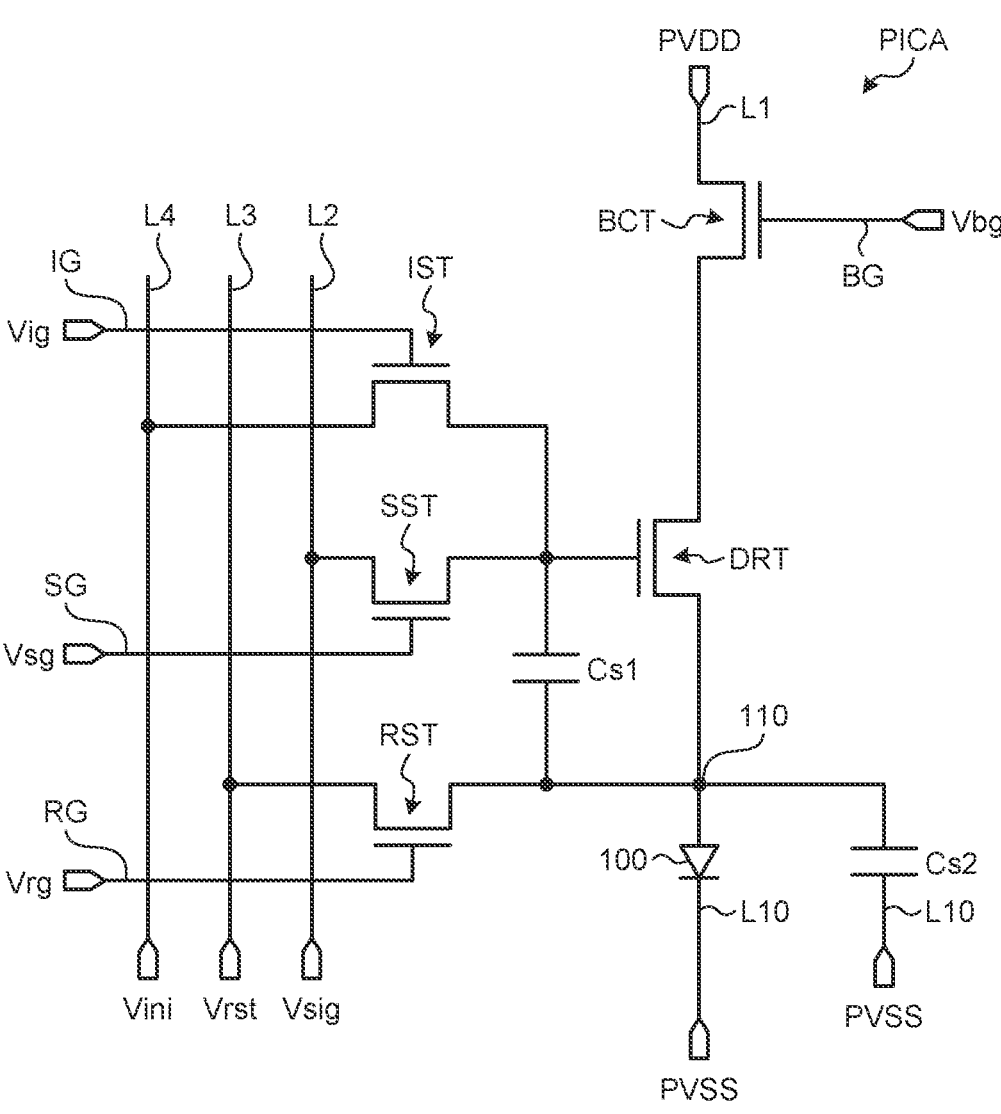
FIG. 3 is a circuit diagram illustrating an example of the configuration of a pixel circuit of the display device.

FIG. 3 is a circuit diagram illustrating an example of the configuration of a pixel circuit of the display device. A pixel circuit PICA illustrated in FIG. 3 is provided in each of the first pixels 49R, the second pixels 49G, and the third pixels 49B. The pixel circuits PICA are provided on the substrate 10 and supply drive signals (currents) to the light emitting bodies 100. In FIG. 3, explanation of the pixel circuit PICA is applicable to the pixel circuit PICA included in each of the first pixels 49R, the second pixels 49G, and the third pixels 49B.

As illustrated in FIG. 3, the pixel circuit PICA includes the light emitter 100, five transistors, and two capacitors. To be specific, the pixel circuit PICA includes a light emission control transistor BCT, an initialization transistor IST, a writing transistor SST, a reset transistor RST, and a drive transistor DRT. Some transistors may be shared by the adjacent pixels 49. For example, the light emission control transistor BCT may be shared by three pixels 49 via common wiring. The reset transistors RST may be provided in the peripheral region GA, and one reset transistor RST may be provided for each row of the pixels 49, for example. In this case, each reset transistor RST is coupled to the sources of the drive transistors DRT via common wiring.

The transistors included in the pixel circuit PICA are formed by n-type thin film transistors (TFT). The transistors are, however, not limited to being formed thereby and may be formed by p-type TFTs. When the p-type TFTs are used, coupling of a power supply potential as well as a holding capacitor Cs1 and a capacitor Cs2 may be appropriately adapted.

The light emission control scan line BG is coupled to the gate of the light emission control transistor BCT. The initialization control scan line IG is coupled to the gate of the initialization transistor IST. The writing control scan line SG is coupled to the gate of the writing transistor SST. The reset control scan line RG is coupled to the gate of the reset transistor RST.

Each of the light emission control scan line BG, the initialization control scan line IG, the writing control scan line SG, and the reset control scan line RG is coupled to the drive circuits 12 (see FIG. 1). The drive circuits 12 supply a light emission control signal Vbg, an initialization control signal Vig, a writing control signal Vsg, and a reset control signal Vrg to the light emission control scan line BG, the initialization control scan line IG, the writing control scan line SG, and the reset control scan line RG, respectively.

The drive IC 210 (see FIG. 1) supplies video image signals Vsig to the pixel circuits PICA included in the first pixels 49R, the second pixels 49G, and the third pixels 49B in a time division manner. Switch circuits such as multiplexers are provided between the drive IC 210 and the respective columns of the first pixels 49R, the second pixels 49G, and the third pixels 49B. The video image signals Vsig are supplied to the writing transistors SST via video image signal lines L2. The drive IC 210 supplies reset power supply potentials Vrst to the reset transistors RST via reset signal lines L3. The drive IC 210 supplies initialization potentials Vini to the initialization transistors IST via initialization signal lines L4.

The light emission control transistor BCT, the initialization transistor IST, the writing transistor SST, and the reset transistor RST function as switching elements for selecting conduction and non-conduction between two nodes. The drive transistor DRT functions as a current control element for controlling the current flowing through the light emitter 100 in accordance with a voltage between the gate and the drain thereof.

The cathode (cathode electrode 114) of the light emitter 100 is coupled to a cathode power supply line L10. An anode (anode electrode 110) of the light emitter 100 is coupled to an anode power supply line L1 (first power supply line) via the drive transistor DRT and the light emission control transistor BCT. An anode power supply potential PVDD (first potential) is supplied to the anode power supply line L1. A cathode power supply potential PVSS (second potential) is supplied to the cathode power supply line L10. The anode power supply potential PVDD is higher than the cathode power supply potential PVSS is. The cathode power supply line L10 includes the cathode wiring 60.

The pixel circuit PICA includes the capacitor Cs1 and the capacitor Cs2. The capacitor Cs1 is a holding capacitor formed between the gate and the source of the drive transistor DRT. The capacitor Cs2 is an additional capacitor formed between the source of the drive transistor DRT and the anode of the light emitter 100 and the cathode power supply line L10.

The display device 1 drives the pixels 49 of the first row to the pixels 49 of the final row to display an image for one frame in one frame period.

In a reset period, control signals that are supplied from the drive circuits 12 cause the potentials of the light emission control scan lines BG to be the low (L) level and cause the potentials of the reset control scan lines RG to be the high (H) level. The light emission control transistors BCT are thereby turned OFF (non-conduction states), and the reset transistors RST are turned ON (conduction states).

With these states, electric charges remaining in the pixels 49 flow to the outside via the reset transistors RST, and the sources of the drive transistors DRT are fixed to the reset power supply potential Vrst. The reset power supply potential Vrst is set so as to have a predetermined potential difference from the cathode power supply potential PVSS. In this case, the potential difference between the reset power supply potential Vrst and the cathode power supply potential PVSS is less than a potential difference at which the light emitting bodies 100 start light emission.

Then, control signals that are supplied from the drive circuits 12 cause the potentials of the initialization control scan lines IG to be the H level. The initialization transistors IST are turned ON. The gates of the drive transistors DRT are fixed to the initialization potential Vini via the initialization transistors IST.

The drive circuits 12 turn the light emission control transistors BCT ON and turn the reset transistors RST OFF. The drive transistors DRT are turned OFF when source potentials thereof become (Vini−Vth). A threshold voltage Vth of the drive transistor DRT can thereby be acquired for each pixel 49, and variation in the threshold voltage Vth among the pixels 49 is offset.

Subsequently, in a video image signal writing operation period, control signals that are supplied from the drive circuits 12 turn the light emission control transistors BCT OFF, turn the initialization transistors IST OFF, and turn the writing transistors SST ON. In the pixels 49 belonging to one row, the video image signals Vsig are input to the gates of the drive transistors DRT. The video image signal line L2 extends in the second direction Dy and is coupled to the pixels 49 of a plurality of rows that belong to the same column. The video image signal writing operation period is therefore executed for each row.

Thereafter, in a light emission operation period, control signals that are supplied from the drive circuits 12 turn the light emission control transistors BCT ON and turn the writing transistors SST OFF. The anode power supply potentials PVDD are supplied from the anode power supply lines L1 to the drive transistors DRT via the light emission control transistors BCT. The drive transistors DRT supply, to the light emitting bodies 100, currents corresponding to voltages between the gates and the sources thereof. Each light emitter 100 emits light with luminance corresponding to the current.

The drive circuits 12 may drive the pixels 49 for each row, drive the pixels 49 for two rows simultaneously, or drive the pixels 49 for equal to or more than three rows simultaneously.

The above-mentioned configuration of the pixel circuit PICA illustrated in FIG. 3 is merely an example and can be appropriately modified. For example, the number of wiring lines and the number of transistors in one pixel 49 may be different. The pixel circuit PICA can also employ the configuration of a current mirror circuit or the like.

Figure 4:
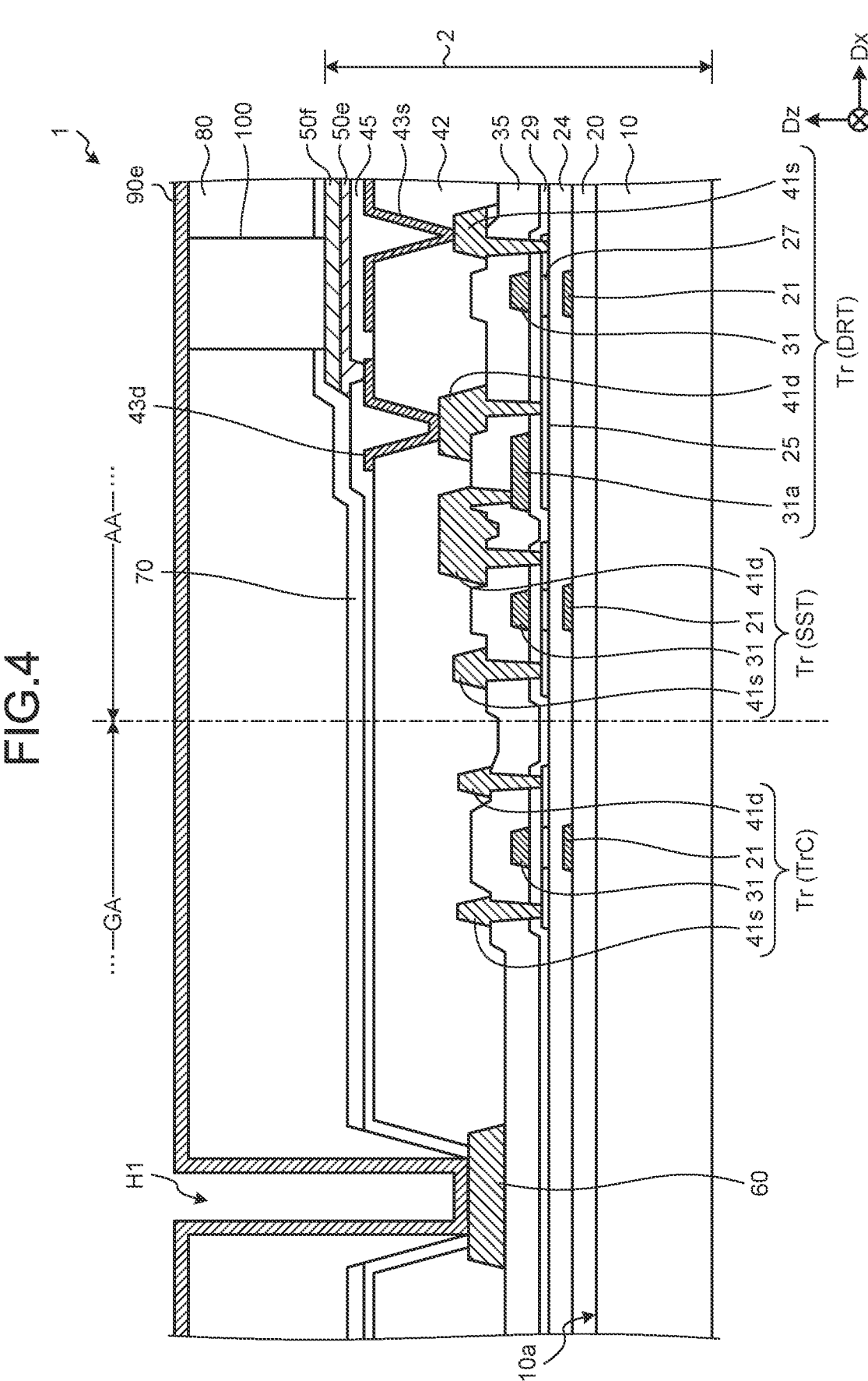
FIG. 4 is a cross-sectional view cut along line IV-IV' in FIG. 1.

FIG. 4 is a cross-sectional view cut along line IV-IV' in FIG. 1. As illustrated in FIG. 4, the array substrate 2 of the display device 1 includes the substrate 10 and the transistors. The substrate 10 has the first surface 10a and a second surface 10b on the opposite side to the first surface 10a. The substrate 10 is an insulating substrate and is, for example, a glass substrate, a quartz substrate, or a flexible substrate made of acrylic resin, epoxy resin, polyimide resin, or polyethylene terephthalate (PET) resin.

In the present specification, the direction toward the light emitting bodies 100 from the substrate 10 in the direction perpendicular to the surface of the substrate 10 is an "upper side" or simply "upward". The direction toward the substrate 10 from the light emitting bodies 100 is a "lower side" or simply "downward". When a mode in which another structure is arranged upward with respect to a certain structure is represented, simple expression "above" includes both of the case in which the other structure is arranged just above the certain structure so as to be in contact with the certain structure and the case in which the other structure is arranged above the certain structure with still another structure interposed therebetween, unless otherwise specified.

An undercoat layer 20 is provided above the first surface 10a of the substrate 10. The transistors are provided above the undercoat layer 20. For example, the drive transistors DRT and the writing transistors SST included in the pixels 49 are provided as the transistors in the display region AA of the substrate 10. Transistors TrC included in the drive circuits 12 are provided as the transistors in the peripheral region GA of the substrate 10. Among the transistors, the drive transistor DRT, the writing transistor SST, and the transistor TrC are illustrated but the light emission control transistor BCT, the initialization transistor IST, and the reset transistor RST included in the pixel circuit PICA also have similar multilayered structures to that of the drive transistor DRT. In the following description, when the transistors need not to be distinguished from one another for description, they are expressed simply as transistors Tr.

The transistors Tr are TFTs having double-sided gate structures, for example. Each of the transistors Tr has a first gate electrode 21, a second gate electrode 31, a semiconductor layer 25, a source electrode 41s, and a drain electrode 41d. The first gate electrodes 21 are provided above the undercoat layer 20. An insulating film 24 is provided above the undercoat layer 20 and covers the first gate electrodes 21. The semiconductor layers 25 are provided above the insulating film 24. The semiconductor layers 25 are made of, for example, polysilicon. The semiconductor layers 25 are not limited thereto and may be microcrystalline oxide semiconductors, amorphous oxide semiconductors, low-temperature polysilicon, or the like. An insulating film 29 is provided above the semiconductor layers 25. The second gate electrodes 31 are provided above the insulating film 29.

The undercoat layer 20 and the insulating films 24, 29, and an insulating film 45 are inorganic insulating films and are made of, for example, silicon oxide ($SiO_2$) or silicon nitride (SiN). The first gate electrodes 21 and the second gate electrodes 31 face each other in the third direction Dz with the insulating film 24, the semiconductor layers 25, and the insulating film 29 interposed therebetween. Portions of the insulating films 24 and 29 that are interposed between the first gate electrodes 21 and the second gate electrodes 31 function as gate insulating films. Portions of the semiconductor layers 25 that are interposed between the first gate electrodes 21 and the second gate electrodes 31 function as channel regions 27 of the transistors Tr. Portions of the semiconductor layers 25 that are coupled to the source electrodes 41s are source regions of the transistors Tr, and portions thereof that are coupled to the drain electrodes 41d are drain regions of the transistors Tr. Low-concentration impurity regions are provided between the channel regions 27 and the source regions and between the channel regions 27 and the drain regions. Although only the n-type TFTs are indicated as the transistors Tr, the p-type TFTs may be formed at the same time.

Gate lines 31a are coupled to the second gate electrodes 31 of the drive transistors DRT. The insulating film 29 is provided between the substrate 10 and the gate lines 31a, and the capacitors CS are formed between the gate lines 31a and the substrate 10. The first gate electrodes 21, the second gate electrodes 31, and the gate lines 31a are made of, for example, aluminum (Al), copper (Cu), silver (Ag), molybdenum (Mo), or an alloy film thereof.

In the embodiment, the transistors Tr are not limited to having the double-sided gate structures. The transistors Tr may be bottom gate-type transistors in which the gate electrodes are formed by only the first gate electrodes 21. The transistors Tr may alternatively be top gate-type transistors in which the gate electrodes are formed by only the second gate electrodes 31. The undercoat layer 20 need not be provided.

The display device 1 includes an insulating film 35 that is provided above the first surface 10a of the substrate 10 and covers the transistors Tr. The source electrodes 41s are provided above the insulating film 35 and are coupled to the sources of the transistors Tr via through-holes provided in the insulating film 35. The drain electrodes 41d are provided above the insulating film 35 and are coupled to the drains of the transistors Tr via through-holes provided in the insulating film 35. The cathode wiring 60 is provided above the insulating film 35 in the peripheral region GA. An insulating film 42 covers the source electrodes 41s, the drain electrodes 41d, and the cathode wiring 60. The insulating film 35 is an inorganic insulating film, and the insulating film 42 is an organic insulating film. The source electrode 41s and the drain electrode 41d are formed by a multilayered film of TiAlTi or TiAl as a multilayered structure of titanium and aluminum. The insulating film 42 is made of an organic material such as photosensitive acrylic.

Parts of the source electrodes 41s are formed in regions overlapping with the gate lines 31a. The gate lines 31a and the source electrodes 41s facing each other with the insulating film 35 interposed therebetween form the capacitors Cs1. The gate lines 31a are formed in regions overlapping with parts of the semiconductor layers 25. The capacitors Cs1 also include capacitors formed by the semiconductor layers 25 and the gate lines 31a facing each other with the insulating film 24 interposed therebetween.

The display device 1 includes source coupling wiring lines 43s, drain coupling wiring lines 43d, the insulating film 45, counter anode electrodes 50e, coupling layers 50f, an insulating film 70, a flattening film 80, and the counter cathode electrode 90e. The source coupling wiring lines 43s are provided above the insulating film 42 and are coupled to the source electrodes 41s via through-holes provided in the insulating film 42. The drain coupling wiring lines 43d are provided above the insulating film 42 and are coupled to the drain electrodes 41d via through-holes provided in the insulating film 42. The insulating film 45 is provided above the insulating film 42 and covers the source coupling wiring lines 43s and the drain coupling wiring lines 43d. The counter anode electrodes 50e are provided above the insulating film 45 and are coupled to the drain coupling wiring lines 43d of the drive transistors DRT via through-holes provided in the insulating film 45. The coupling layers 50f are provided above the counter anode electrodes 50e. The light emitting bodies 100 are provided above the coupling layers 50f, and the counter anode electrodes 50e are coupled to the anode electrodes 110 (see FIG. 5) of the light emitting bodies 100 via the coupling layers 50f. The capacitors Cs2 are formed between the counter anode electrodes 50e and the source coupling wiring lines 43s facing each other with the insulating film 45 interposed therebetween. The source coupling wiring lines 43s and the drain coupling wiring lines 43d are formed by, for example, transparent conductors made of ITO or the like.

The insulating film 70 is provided above the insulating film 45 and covers the side surfaces of the counter anode electrodes 50e. The insulating film 70 has openings for mounting the light emitting bodies 100 at positions overlapping with the counter anode electrodes 50e. The area of each of the openings in the insulating film 70 is larger than a contact surface of each light emitter 100 with the counter anode electrode 50e in plan view. Each counter anode electrode 50e is larger than the contact surface of the light emitter 100 with the counter anode electrode 50e in plan view. The flattening film 80 is provided above the insulating film 70 and covers the side surfaces of the light emitting bodies 100. The counter cathode electrode 90e is provided above the flattening film 80. The insulating film 70 is an inorganic insulating film and is made of, for example, a silicon nitride film (SiN). The flattening film 80 is an organic insulating film or an organic/inorganic hybrid insulating film (material in which, for example, an organic group (a methyl group or a phenyl group) is bound to an Si—O main chain). The upper surfaces (cathode electrodes 114; see FIG. 5) of the light emitting bodies 100 are exposed from the flattening film 80. The counter cathode electrode 90e is coupled to the cathode electrodes 114 (see FIG. 5) of the light emitting bodies 100.

The counter cathode electrode 90e is coupled to the cathode wiring 60 provided on the array substrate 2 side via a contact hole H1 provided on the outer side of the display region AA. To be specific, the contact hole H1 is provided in the flattening film 80 and the insulating film 42, and the cathode wiring 14 is provided on the bottom surface of the contact hole H1. The cathode wiring 60 is provided above the insulating film 35. That is to say, the cathode wiring 60 is provided in the same layer as the source electrodes 41s and the drain electrodes 41d are and is made of the same material. The counter cathode electrode 90e is provided continuously from the display region AA to the peripheral region GA and is coupled to the cathode wiring 60 at a bottom portion of the contact hole H1. The counter cathode electrode 90e has openings OP1 in regions overlapping with the light emitting bodies 100.

Figure 5:
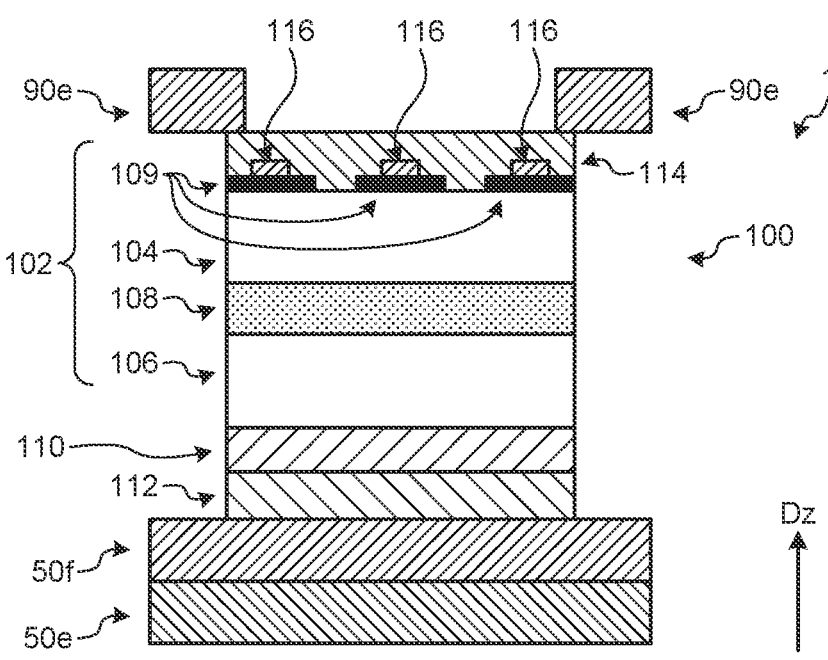
FIG. 5 is a cross-sectional view illustrating an example of the configuration of a light emitter according to the first embodiment.

Next, the configuration of each light emitter 100 is described. FIG. 5 is a cross-sectional view illustrating an example of the configuration of the light emitter in the first embodiment. As illustrated in FIG. 5, the light emitter 100 includes a light emitting element 102, the anode electrode 110, a reflective layer 112, and the cathode electrode 114. The counter anode electrode 50e, the coupling layer 50f, and the counter cathode electrode 90e may be included in the light emitter 100.

The light emitting element 102 is a light emitting layer emitting light. The light emitting element 102 includes an n-type clad layer 104, a p-type clad layer 106, and a light emitting layer 108 provided between the p-type clad layer 106 and the n-type clad layer 104. In the embodiment, the light emitting element 102 is configured by stacking the p-type clad layer 106, the light emitting layer 108, and the n-type clad layer 104 in this order toward the upper side. The light emitting element 102 is formed by a compound semiconductor such as gallium nitride (GaN), aluminum indium gallium phosphide (ALInGaP), aluminum gallium arsenide (AlGaAs), and gallium arsenide phosphide (GaAsP). More specifically, in the embodiment, the p-type clad layer 106 and the n-type clad layer 104 are made of gallium nitride (GaN). The light emitting layer 108 is made of indium gallium nitride (InGaN). The light emitting layer 108 may have a multiple quantum well (MQW) structure in which InGaN and GaN are stacked.

The light emitting element 102 includes an oxide layer 109. The oxide layer 109 is formed by oxidization of the n-type clad layer 104 and is an oxide of gallium (Ga) in the embodiment. More specifically, the oxide layer 109 is made of gallium oxide ($Ga_2O_3$) in the embodiment. The oxide layer 109 is provided above the n-type clad layer 104. The oxide layer 109 is provided so as to be superimposed on only partial regions of the entire area of the n-type clad layer 104 without covering the entire area of the n-type clad layer 104 in plan view in the example of FIG. 5. In other words, it is regarded that the oxide layer 109 has through-holes penetrating therethrough from the upper surface to the lower surface. Accordingly, the light emitting element 102 has regions in which the n-type clad layer 104 is exposed (regions of the through-holes) and regions in which the oxide layer 109 is exposed in plan view when seen from the above.

The light emitter 100 is configured by stacking the reflective layer 112, the anode electrode 110, the p-type clad layer 106, the light emitting layer 108, the n-type clad layer 104, the oxide layer 109, and the cathode electrode 114 in this order toward the upper side. The coupling layer 50f is provided under the light emitter 100, and the counter cathode electrode 90e is provided above the light emitter 100.

The counter anode electrode 50e contains a conductive member, in this example, a metal material. In the embodiment, the counter anode electrode 50e contains titanium (Ti) and aluminum (Al), and, for example, a titanium layer and an aluminum layer are stacked along the third direction Dz. The coupling layer 50f contains a conductive member, in this example, a metal material. In the embodiment, the coupling layer 50f is solder, and more specifically, gold-based solder such as a gold-tin (AuSn) alloy and a silver-tin (AgSn) alloy. The coupling layer 50f joins the counter anode electrode 50e and the reflective layer 112.

The reflective layer 112 is provided above the coupling layer 50f. The reflective layer 112 is a conductive member capable of reflecting light and is made of an alloy containing silver (Ag) in the embodiment. The anode electrode 110 is provided above the reflective layer 112. The anode electrode 110 is a conductive member having translucency and is made of, for example, indium tin oxide (ITO). The anode electrode 110 is electrically coupled to the counter anode electrode 50e via the reflective layer 112 and the coupling layer 50f. The p-type clad layer 106 is provided above the anode electrode 110. The anode electrode 110 is coupled to the p-type clad layer 106.

The cathode electrode 114 is provided above the oxide layer 109. The cathode electrode 114 is coupled to the n-type clad layer 104 via the through-holes provided in the oxide layer 109. The cathode electrode 114 is a conductive member having translucency and is made of, for example, ITO. The cathode electrode 114 preferably includes a coupling layer 116 therein. The coupling layer 116 is provided on the lower surface of the cathode electrode 114, and more specifically, is provided at places at which the oxide layer 109 is provided (places at which the oxide layer 109 has no through-hole). Accordingly, the coupling layer 116 contacts the oxide layer 109 along the lower surface thereof and is coupled to the oxide layer 109. The coupling layer 116 is coupled also to the cathode electrode 114.

The coupling layer 116 contains a conductive member, in this example, a metal material. The coupling layer 116 contains at least one of titanium (Ti) and tin (Sn) in the embodiment. The coupling layer 116 supports coupling between the oxide layer 109 and the cathode electrode 114. For example, when the coupling layer 116 contains tin, it acts as dopant of the oxide layer 109 and dopant of the cathode electrode 114 to make the oxide layer 109 be a low-resistant semiconductor and lower the resistance of the cathode electrode. When the coupling layer 116 contains titanium, it removes oxygen (O) from the oxide layer 109 to support coupling. However, the coupling layer 116 need not be provided.

Figure 6:
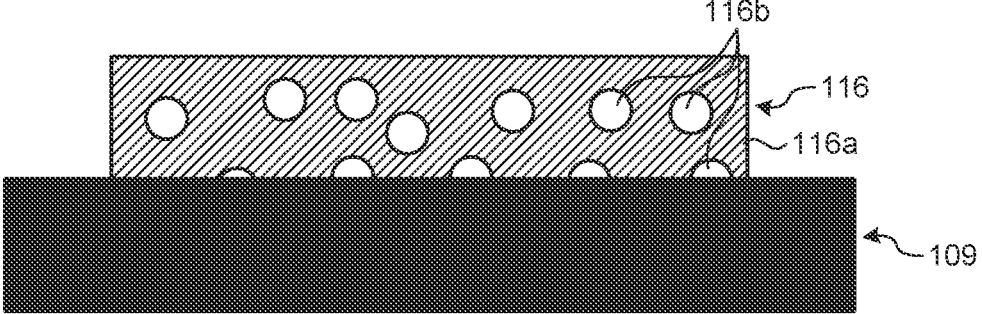
FIG. 6 is a schematic view illustrating an example of a coupling layer.

FIG. 6 is a schematic view illustrating an example of the coupling layer. As illustrated in FIG. 6, the coupling layer 116 may include a first member 116a and second members 116b. The first member 116a is, for example, a tin layer. The second members 116b are made of, for example, titanium (Ti). The second members 116b are provided (dotted) in the first member 116a and are preferably provided also in the surface of the coupling layer 116 on the side contacting the oxide layer 109. That is to say, in the example of FIG. 6, the coupling layer 116 includes both of the first member 116a and the second members 116b in the surface thereof on the side contacting the oxide layer 109. The oxide layer 109 thereby contacts and is coupled to both of titanium and tin. The configuration in FIG. 6 is, however, merely an example.

The counter cathode electrode 90e is provided above the cathode electrode 114. The counter cathode electrode 90e contains a conductive member, in this example, a metal material. The counter cathode electrode 90e contains titanium (Ti) and aluminum (Al). For example, a titanium layer and an aluminum layer are stacked along the third direction Dz, and then, are patterned, so that the counter cathode electrode 90e is partially formed. That is to say, the counter cathode electrode 90e is provided so as to be superimposed on parts of the upper surface of the cathode electrode 114 without occupying the entire area of the upper surface of the cathode electrode 114. Coupling to the counter cathode electrode 90e may be made through the coupling layer 116 without providing the cathode electrode 114.

Figure 7:
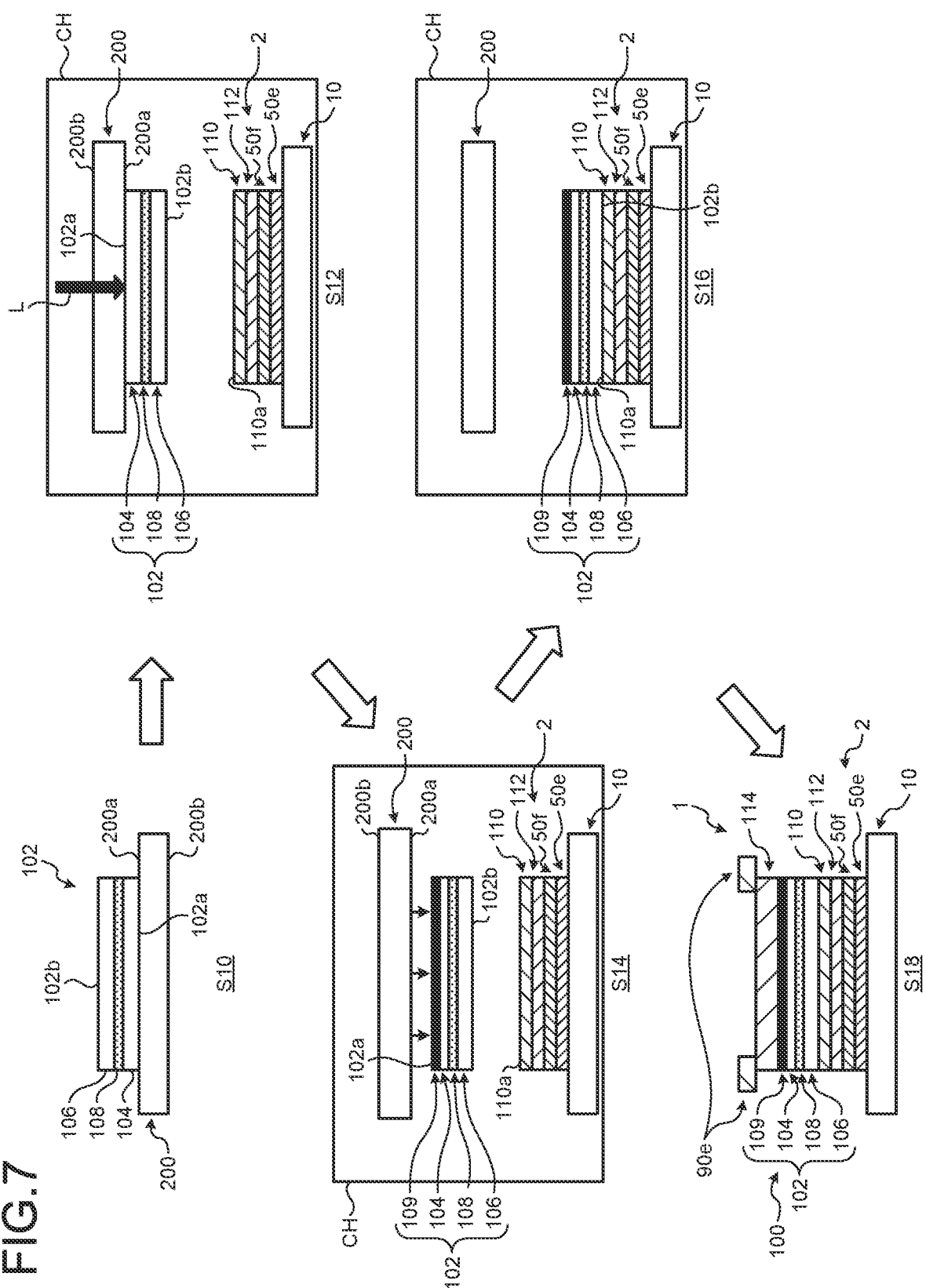
FIG. 7 is a view for explaining a lamination method of the light emitter according to the first embodiment.

The light emitter 100 has the above-mentioned configuration. Next, a method for manufacturing the light emitter 100 will be described. FIG. 7 is a view for explaining a lamination method of the light emitter in the first embodiment. As illustrated in FIG. 7, when the light emitter 100 is laminated, the light emitting element 102 is provided above one surface 200a of a formation substrate 200 by forming the light emitting element 102 above the formation substrate 200 as indicated at step S10 (arrangement step). The formation substrate 200 is a substrate containing $Al_2O_3$, that is, a sapphire substrate in the embodiment. To be specific, a manufacturing device forms films for the light emitting element 102 above the surface 200a of the formation substrate 200 such that the n-type clad layer 104, the light emitting layer 108, and the p-type clad layer 106 are aligned in this order. With this film formation, one surface 102a of the light emitting element 102 contacts and is joined to the one surface 200a of the formation substrate 200. The surface 102a is the surface of the light emitting element 102 on the n-type clad layer 104 side in the alignment of the n-type clad layer 104, the light emitting layer 108, and the p-type clad layer 106, and is the surface of the n-type clad layer 104 on the opposite side to the light emitting layer 108. Another surface 102b of the light emitting element 102 is the surface on the opposite side to the surface 102a. That is to say, the surface 102b is the surface of the light emitting element 102 on the p-type clad layer 106 side in the alignment of the n-type clad layer 104, the light emitting layer 108, and the p-type clad layer 106, and is the surface of the p-type clad layer 106 on the opposite side to the light emitting layer 108.

Then, the surface 200a of the formation substrate 200 on which the light emitting element 102 has been formed is made to face the surface of the array substrate 2 and laser light L is emitted to the light emitting element 102 in a chamber CH, as indicated at step S12. The inside of the chamber CH is controlled to have a predetermined oxygen concentration. The oxygen concentration in the chamber CH is higher than the oxygen concentration of the air in the embodiment. For example, the inside of the chamber CH is controlled to be in either of a state where the $O_2$ concentration is higher than the $O_2$ concentration of the air or a state where the $O_3$ concentration is higher than the $O_3$ concentration of the air. In this case, the $O_2$ concentration in the chamber CH is preferably equal to or higher than 22 vol % and is preferably equal to or lower than 30 vol %. The $O_3$ concentration in the chamber CH is preferably equal to or higher than 0.00001 vol % and is preferably equal to or lower than 0.0001 vol %.

The counter anode electrode 50e, the coupling layer 50f, the reflective layer 112, and the anode electrode 110 are stacked on the surface of the array substrate 2 at step S12. Although not illustrated in FIG. 7, the array substrate 2 further includes the layers (transistors Tr and the like) illustrated in FIG. 4 that are stacked between the counter anode electrode 50e and the substrate 10. That is to say, the surface of the array substrate 2 on the side on which the counter anode electrode 50e and the like are stacked is made to face the surface 200a of the formation substrate 200 at step S12. Accordingly, the surface 102b of the light emitting element 102 and a surface 110a of the anode electrode 110 face each other.

The laser light L is emitted to the surface 102a (first surface in the embodiment) of the light emitting element 102 in this state, that is, the state where the surface 200a of the formation substrate 200 and the surface of the array substrate 2 face each other in the chamber CH. To be specific, the laser light L is emitted to the formation substrate 200 from a surface 200b side of the formation substrate 200. The laser light L enters the inside of the formation substrate 200 from the surface 200b, reaches the surface 200a, and is emitted to the surface 102a of the light emitting element 102 that contacts the surface 200a. The light emitting element 102 is thus irradiated with the laser light L to be separated (stripped off) from the formation substrate 200 as indicated at step S14. That is to say, the light emitting element 102 is stripped off from the formation substrate 200 by laser lift-off at step S12 and step S14 (separation step).

The laser light L is preferably set to have a wavelength range where it passes through the formation substrate 200 and does not pass through the n-type clad layer 104 of the light emitting element 102. For example, the laser light L preferably has energy of 3.5 eV (electron volts) to 9.9 eV, the energy corresponding to a wavelength range where it passes through sapphire and does not pass through gallium nitride. The laser light L is preferably set to have a wavelength equal to or lower than 310 nm. The oxide layer 109 can thereby be formed more appropriately.

The oxygen concentration is high in the chamber CH in which the light emitting element 102 has been stripped off by emission of the laser light L. Accordingly, the surface 102a of the n-type clad layer 104 to which the laser light L has been emitted is oxidized, so that the oxide layer 109 is formed on the surface 102a, as indicated at step S14.

When the light emitting element 102 is stripped off, the surface of the array substrate 2 faces the surface 200a of the formation substrate 200. Accordingly, the light emitting element 102 stripped off from the formation substrate 200 is stacked on the surface of the array substrate 2 as indicated at step S16 (stacking step). More specifically, the surface 102b (second surface in the first embodiment) of the light emitting element 102 contacts the surface of the array substrate 2, in this example, the surface 110a of the anode electrode 110, and the surface 102b of the light emitting element 102 (p-type clad layer 106) and the surface 110a of the anode electrode 110 are joined to each other. That is to say, the light emitting element 102 is transferred onto the array substrate 2.

As indicated at step S12 to step S16, emission of the laser light L to the light emitting element 102 under the atmosphere where the oxygen concentration is high separates the light emitting element 102 from the formation substrate 200, forms the oxide layer 109, and transfers the separated light emitting element 102 on which the oxide layer 109 has been formed, onto the array substrate 2 in the embodiment.

After the light emitting element 102 is transferred onto the array substrate 2, the cathode electrode 114 is stacked above the light emitting element 102 as indicated at step S18, thereby forming the light emitter 100. The through-holes may be opened in the oxide layer 109 before the cathode electrode 114 is stacked at step S18. The cathode electrodes are partially formed by processing after the counter cathode electrode 90e is stacked above the cathode electrodes 114, so that the display device 1 is formed.

Although only the light emitting element 102 is formed above the formation substrate 200 in the embodiment, members of the light emitter 100 other than the light emitting element 102 may be formed. For example, at least one of the cathode electrode 114, the coupling layer 116, the coupling layer 50f, the reflective layer 112, and the anode electrode 110 may be formed on the formation substrate 200 together with the light emitting element 102 at step S10 and be transferred onto the array substrate 2. Although FIG. 7 illustrates the process that is performed in the chamber CH, the light emitter 100 is not limited to being laminated in the chamber CH. The atmosphere where the oxygen concentration is higher than that of the air may be formed by spraying oxygen onto the substrate during the transfer process at step S12, S14, or S16, for example.

The inorganic light emitting element can be formed above the formation substrate 200, and then, be transferred onto the array substrate 2 without being directly formed on the array substrate 2 because a film formation temperature thereof is high and so on. The laser light L can be emitted to the inorganic light emitting element (laser lift-off can be performed) in order to transfer the inorganic light emitting element onto the array substrate 2. When the laser light L is excessively emitted to the inorganic light emitting element, there is a risk that a surface structure thereof is deteriorated and becomes unstable to lower light emitting performance. For example, the inorganic light emitting element takes impurities into the surface thereof by excessive irradiation with the laser light L, and the impurities lower the light emitting performance. For example, it has been reported that the light emitting performance is lowered when nitrogen (N) as the impurities is taken into gallium nitride.

A recombination velocity R of the inorganic light emitting element is expressed by the following equation (1).

$$R = A^* n + B^* n^2 + c^* n^3 \tag{1}$$

In this equation, n is a carrier density and is a variable corresponding to an applied current. A is an SRH recombination coefficient, B is a light emission coupling coefficient, and C is an Auger recombination coefficient. A, B, and C are coefficients that are determined in accordance with performance of the inorganic light emitting element, and the inorganic light emitting element has higher light emitting efficiency as B is higher and A and C are lower. When the inorganic light emitting element is excessively irradiated with the laser light L, there is a risk that B becomes lower than that before the laser light L is emitted. A, B, and C when the laser light L is emitted can be respectively about 1.2 times, about 0.8 times, and about 1.2 times as much as those before the laser light L is emitted. In such a case, the value of B can be lowered to lower the light emitting performance.

By contrast, in the embodiment, the laser light L is emitted under the atmosphere where the oxygen concentration is high, so that the oxide layer 109 is formed on the surface 102a of the light emitting element 102 to which the laser light L has been emitted. The oxide layer 109 is a stable structure, which prevents the impurities from being taken thereinto, thereby preventing the light emitting performance from being lowered. That is to say, there is a possibility that even after the light emitting element 102 is stripped off by the emission of the laser light L to the surface 102a, the laser light L is continuously emitted to the surface 102a and the light emitting element 102 is excessively irradiated with the laser light L. As for this point, since the oxide layer 109 is formed on the surface 102a of the light emitting element 102 in the embodiment, deterioration of the structure is prevented to prevent the light emitting performance from being lowered even when the laser light L is excessively emitted to the oxide layer 109 on the surface 102a after the light emitting element 102 is stripped off. The oxide layer 109 is formed simultaneously with or after stripping of the surface 102a of the light emitting element 102 from the formation substrate 200, for example. In both of the cases, the oxide layer 109 can protect the light emitting element 102 from the excessively emitted laser light L. With formation of the oxide layer 109, for example, A, B, and C when the laser light L is emitted can be respectively equal to or lower than about 1.1 times, equal to or higher than about 0.9 times, and equal to or lower than about 1.1 times as much as A, B, and C before the laser light L is emitted, thereby preventing lowering of B, that is, lowering of the light emitting performance.

In the embodiment, each light emitter 100 is of a type (hereinafter, a face-up type) in which the anode electrode 110 provided in a lower portion is coupled to the counter anode electrode 50e and the cathode electrode 114 provided in an upper portion thereof is coupled to the counter cathode electrode 90e. The light emitter 100 is, however, not limited to the face-up type. The light emitter 100 may be of, for example, a face-down type in which the lower portion is coupled to both of the counter anode electrode 50e and the counter cathode electrode 90e. Hereinafter, an example of the face-down type will be described.

Figure 8:
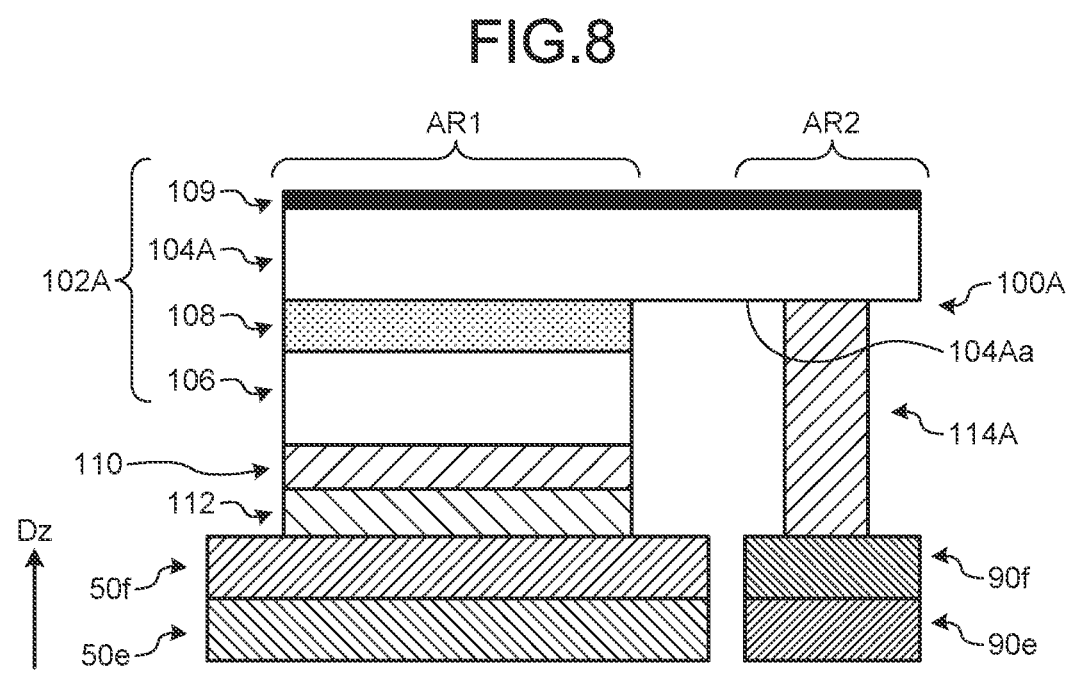

FIG. 8 is a view illustrating a light emitter in another example of the first embodiment. As illustrated in FIG. 8, a light emitter 100A in another example is of the face-down type. An n-type clad layer 104A of a light emitting element 102A is configured to have an area larger than those of the p-type clad layer 106 and the light emitting layer 108 in plan view. The light emitter 100A has a region AR1 in which the n-type clad layer 104A is superimposed on the p-type clad layer 106 and the light emitting layer 108 and a region AR2 in which the n-type clad layer 104A is not superimposed on the p-type clad layer 106 and the light emitting layer 108. In the region AR1, the light emitter 100A is configured by stacking the counter anode electrode 50e, the coupling layer 50f, the reflective layer 112, the anode electrode 110, the p-type clad layer 106, the light emitting layer 108, the n-type clad layer 104, and the oxide layer 109 in this order toward the upper side. On the other hand, in the region AR2, the light emitter 100A is configured by stacking the counter cathode electrode 90e, a coupling layer 90f, a cathode electrode 114A, the n-type clad layer 104, and the oxide layer 109 in this order toward the upper side. The counter cathode electrode 90e is provided under the light emitting element 102A unlike the counter cathode electrode 90e illustrated in FIG. 5. The coupling layer 90f is provided instead of the coupling layer 116, and the coupling layer 90f is made of the same material as that of the coupling layer 50f, for example. The cathode electrode 114A need not have translucency unlike the cathode electrode 114 illustrated in FIG. 5, and it is sufficient that the cathode electrode 114A is made of a material having conductivity. For example, the cathode electrode 114A contains titanium (Ti) and aluminum (Al), and, for example, a titanium layer, an aluminum layer, and a titanium layer are stacked along the third direction Dz. In the case of the face-down type, the oxide layer 109 on the upper side may have no through-hole.

Figure 9:
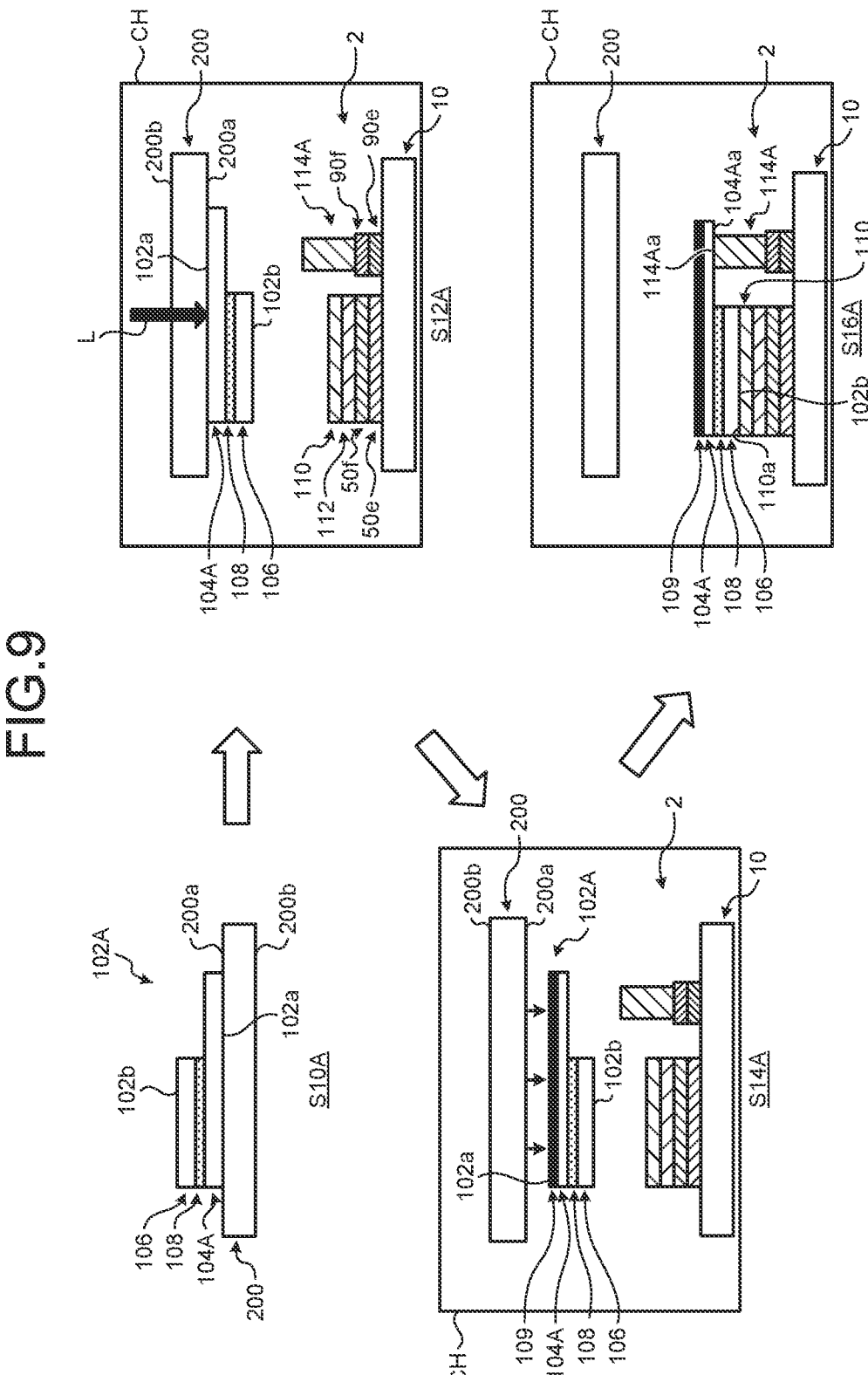
FIG. 9 is a view for explaining a lamination method of the light emitter in another example of the first embodiment.

FIG. 9 is a view for explaining a lamination method of the light emitter in another example of the first embodiment. When the light emitter 100A of the face-down type as illustrated in FIG. 8 is manufactured, steps S10A, S12A, S14A, and S16A are executed as illustrated in FIG. 9. Steps S10A, S12A, S14A, and S16A are similar processes to steps S10, S12, S14, and S16 in FIG. 7 other than the shape of the light emitter 100A and the layers above the array substrate 2, and detail explanation thereof is therefore omitted. For example, the light emitting element 102A is formed above the formation substrate 200 as indicated at step S10A. The cathode electrode 114A, the coupling layer 90f, and the counter cathode electrode 90e are formed on the array substrate 2 at step S12A. As indicated at steps S12A, S14A, and S16A, the laser light L is emitted to the light emitting element 102A above the formation substrate 200 to separate the light emitting element 102A from the formation substrate 200, form the oxide layer 109, and transfer the light emitting element 102A onto the array substrate 2 in the chamber CH. As indicated at step S16A, the counter cathode electrode 90e is formed above the substrate 10, so that the coupling layer 116 to the oxide layer 109 and the contact hole H1 illustrated in FIG. 3 are not necessary. The counter cathode electrode 90e receives supply of the cathode power supply potential PVSS via wiring formed above the substrate 10 similarly to the counter anode electrode 50e.

Although only the light emitting element 102 is formed above the formation substrate 200 also in the example of FIG. 9, members of the light emitter 100 other than the light emitting element 102 may be formed. For example, at least one of the counter anode electrode 50e, the coupling layer 50f, the reflective layer 112, the anode electrode 110, the counter cathode electrode 90e, the coupling layer 90f, and the cathode electrode 114A may be formed above the formation substrate 200 together with the light emitting element 102A and be transferred onto the array substrate 2.

As described above, the method for manufacturing the inorganic light emitter (light emitter 100) in the embodiment includes the arrangement step, the separation step, and the stacking step. At the arrangement step (S10), the inorganic light emitting element (light emitting element 102) is provided above one surface (surface 200a) of the substrate (formation substrate 200). At the separation step (S12), the inorganic light emitting element (light emitting element 102) is separated from the substrate (formation substrate 200) and the oxide layer (oxide layer 109) is formed on the first surface (surface 102a) of the inorganic light emitting element (light emitting element 102) that contacts the one surface of the substrate by emitting the laser light L to the first surface (surface 102a) of the inorganic light emitting element (light emitting element 102) under the atmosphere where the oxygen concentration is higher than that of the air. At the stacking step (S16), the inorganic light emitting element (light emitting element 102) separated at the separation step is stacked on the array substrate (array substrate 2) to manufacture the inorganic light emitter (light emitter 100).

As described above, excessive emission of the laser light L to the light emitting element 102 in the transfer of the light emitting element 102 onto the array substrate 2 can lower the light emitting performance. To cope with this, the manufacturing method in the embodiment includes formation of the stable oxide layer on the surface of the light emitting element 102 to which the laser light L is emitted. Accordingly, even when the laser light L is excessively emitted, the oxide layer can protect the light emitting element 102 to prevent the light emitting performance from being lowered.

At the separation step, the oxygen concentration in the emission of the laser light L is preferably set to be in a range of 22% to 30%. Setting of the oxygen concentration in such a manner enables the oxide layer 109 to be formed appropriately.

The light emitting element 102 is formed above the formation substrate 200 at the arrangement step S10, and the laser light L is emitted to the light emitting element 102 above the formation substrate 200 to separate the light emitting element 102 from the formation substrate 200 at steps S12 and S14. With use of the laser lift-off as described above, the light emitting element 102 can be appropriately separated from the formation substrate 200, and the oxide layer 109 can prevent the light emitting performance from being lowered.

At the separation steps S12 and S14, the light emitting element 102 is transferred onto the array substrate 2 from the formation substrate 200 such that the surface 102b (second surface) of the light emitting element 102 contacts the surface of the array substrate 2 (the surface 110a of the anode electrode 110 in this example) by emitting the laser light L to the light emitting element 102 in the state where the surface 200a of the formation substrate 200 is made to face the surface of the array substrate 2. When the light emitting element 102 is directly transferred onto the array substrate 2 from the formation substrate 200 by the emission of the laser light L in this manner, the process is simplified and the oxide layer 109 can prevent the light emitting performance from being lowered.

The light emitting element 102 is configured by stacking, above the formation substrate 200, the n-type clad layer 104A, the light emitting layer 108, and the p-type clad layer 106 in this order from the surface 200a side of the formation substrate 200. With use of the manufacturing method as in the embodiment in manufacturing the light emitting element 102 having such configuration, the oxide layer 109 is formed to prevent the light emitting performance from being lowered.

In the manufacturing method in the embodiment, the coupling layer 116 containing at least one of titanium and tin is preferably formed between the oxide layer 109 of the light emitting element 102 and the electrode (cathode electrode 114 in this example) provided above the array substrate 2. For example, when tin is provided between the oxide layer 109 and the electrode, it can act as the dopant of the oxide layer 109 to make the oxide layer 109 be the low-resistant semiconductor. On the other hand, when titanium is provided between the oxide layer 109 and the electrode, it can remove oxygen (O) from the oxide layer 109 to support coupling.

Second Embodiment

Next, a second embodiment is described. In the first embodiment, the light emitting element 102 is directly transferred onto the array substrate 2 from the formation substrate 200. Alternatively, the light emitting element 102 is transferred onto the array substrate 2 through a transfer substrate 220 from the formation substrate 200 in the second embodiment. Although the oxide layer 109 is formed only on the surface 102a of the light emitting element 102 in the first embodiment, the oxide layers are formed on both of the surface 102a and the surface 102b in the second embodiment. Description of configurations and processes in the second embodiment that are common to those in the first embodiment is omitted.

Figure 10:
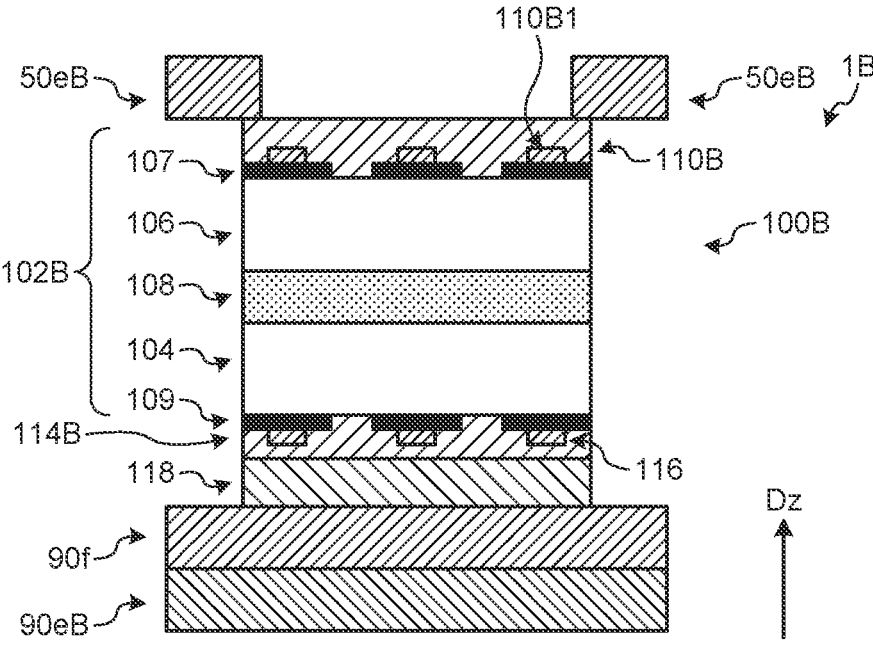
FIG. 10 is a cross-sectional view illustrating an example of the configuration of a light emitter according to a second embodiment.

FIG. 10 is a cross-sectional view illustrating an example of the configuration of a light emitter in the second embodiment. As illustrated in FIG. 10, a light emitter 100B in the second embodiment includes a light emitting element 102B, an anode electrode 110B, a cathode electrode 114B, and a reflective layer 118. The light emitting element 102B is configured by stacking the oxide layer 109, the n-type clad layer 104, the light emitting layer 108, the p-type clad layer 106, and an oxide layer 107 in this order toward the upper side. The oxide layer 109 is provided under the n-type clad layer 104. The oxide layer 109 has through-holes penetrating therethrough from the upper surface to the lower surface.

The oxide layer 107 is provided above the p-type clad layer 106. The oxide layer 107 is a layer formed by oxidization of the p-type clad layer 106 and is an oxide of gallium (Ga) in the embodiment. More specifically, the oxide layer 107 is made of gallium oxide ($Ga_2O_3$) in the embodiment. The oxide layer 107 has through-holes penetrating therethrough from the upper surface to the lower surface.

The light emitter 100B is configured by stacking the reflective layer 118, the cathode electrode 114B, the oxide layer 109, the n-type clad layer 104, the light emitting layer 108, the p-type clad layer 106, the oxide layer 107, and the anode electrode 110B in this order toward the upper side. A display device 1B in the second embodiment is configured by stacking counter cathode electrodes 90eB, the coupling layers 90f, the reflective layers 118, the cathode electrodes 114B, the oxide layers 109, the n-type clad layers 104, the light emitting layers 108, the p-type clad layers 106, the oxide layers 107, the anode electrodes 110B, and a counter anode electrode 50eB in this order toward the upper side.

In the second embodiment, the counter cathode electrode 90eB is provided under the light emitter 100B. The counter cathode electrode 90eB, for example, is made of a similar material and has a similar shape to those of the counter anode electrode 50e in the first embodiment. The counter cathode electrode 90eB is formed above the substrate 10 and is wiring made of a metal material such as Ti and Al, for example. The cathode power supply potential PVSS is supplied to the counter cathode electrode 90e. The coupling layer 90f is provided above the counter cathode electrode 90eB. The coupling layer 90f is made of a similar material to that of the coupling layer 50f in the first embodiment. The coupling layer 90f joins the counter cathode electrode 90eB and the reflective layer 118.

The reflective layer 118 is provided above the coupling layer 90f. The reflective layer 118 is made of a similar material to that of the reflective layer 112 in the first embodiment. The cathode electrode 114B is provided above the reflective layer 118. The cathode electrode 114B is electrically coupled to the counter cathode electrode 90eB via the reflective layer 118 and the coupling layer 90f. The reflective layer 118 may be coupled through the coupling layer 116 without providing the cathode electrode 114B.

The oxide layer 109 is provided above the cathode electrode 114B. The cathode electrode 114B is coupled to the n-type clad layer 104 via the through-holes provided in the oxide layer 109. The cathode electrode 114B preferably includes the coupling layer 116 therein. The coupling layer 116 is provided on the upper surface of the cathode electrode 114B, and more specifically, is provided at places at which the oxide layer 109 is provided (places at which the oxide layer 109 has no through-hole). Accordingly, the coupling layer 116 contacts the oxide layer 109 along the upper surface thereof and is coupled to the oxide layer 109. The coupling layer 116 is coupled also to the cathode electrode 114B.

The anode electrode 110B is provided above the oxide layer 107. The anode electrode 110B is coupled to the p-type clad layer 106 via the through-holes provided in the oxide layer 107. The anode electrode 110B is made of a similar material to that of the anode electrode 110 in the first embodiment. The anode electrode 110B preferably includes a coupling layer 110B1 therein. The coupling layer 110B1 is provided on the lower surface of the anode electrode 110B, and more specifically, is provided at places at which the oxide layer 107 is provided (places at which the oxide layer 107 has no through-hole). Accordingly, the coupling layer 110B1 contacts the oxide layer 107 along the lower surface thereof and is coupled to the oxide layer 107. The coupling layer 110B1 is coupled also to the anode electrode 110B. The coupling layer 110B1 may couple the oxide layer 107 and the counter anode electrode 50eB without providing the anode electrode 110B.

The coupling layer 110B1 is made of a similar material to that of the coupling layer 116. For example, when tin is provided as the coupling layer 110B1 between the oxide layer 107 and the anode electrode 110B, it can act as dopant of the oxide layer 107 to make the oxide layer 107 be a low-resistant semiconductor. On the other hand, when titanium is provided as the coupling layer 110B1 between the oxide layer 107 and the anode electrode 110B, it can remove oxygen (O) from the oxide layer 107 to support coupling. The coupling layer 110B1 need not be provided.

The counter anode electrode 50eB is partially provided above the anode electrode 110B. That is to say, in the second embodiment, the counter anode electrode 50eB is provided above the light emitter 100B. The counter anode electrode 50eB is provided so as to be superimposed on parts of the upper surface of the anode electrode 110B without occupying the entire area of the upper surface of the cathode electrode 110B. The counter anode electrode 50eB, for example, is made of a similar material and has a similar shape to those of the counter cathode electrode 90e in the first embodiment. The counter anode electrode 50eB is made of, for example, ITO as a conductive member having translucency and is formed so as to cover the light emitting bodies 100B. The counter anode electrode 50eB has openings and is coupled to the anode electrode 110B or the coupling layer 110B1 around each opening. The anode power supply potential PVDD is supplied to the counter anode electrode 50eB.

Figure 11:
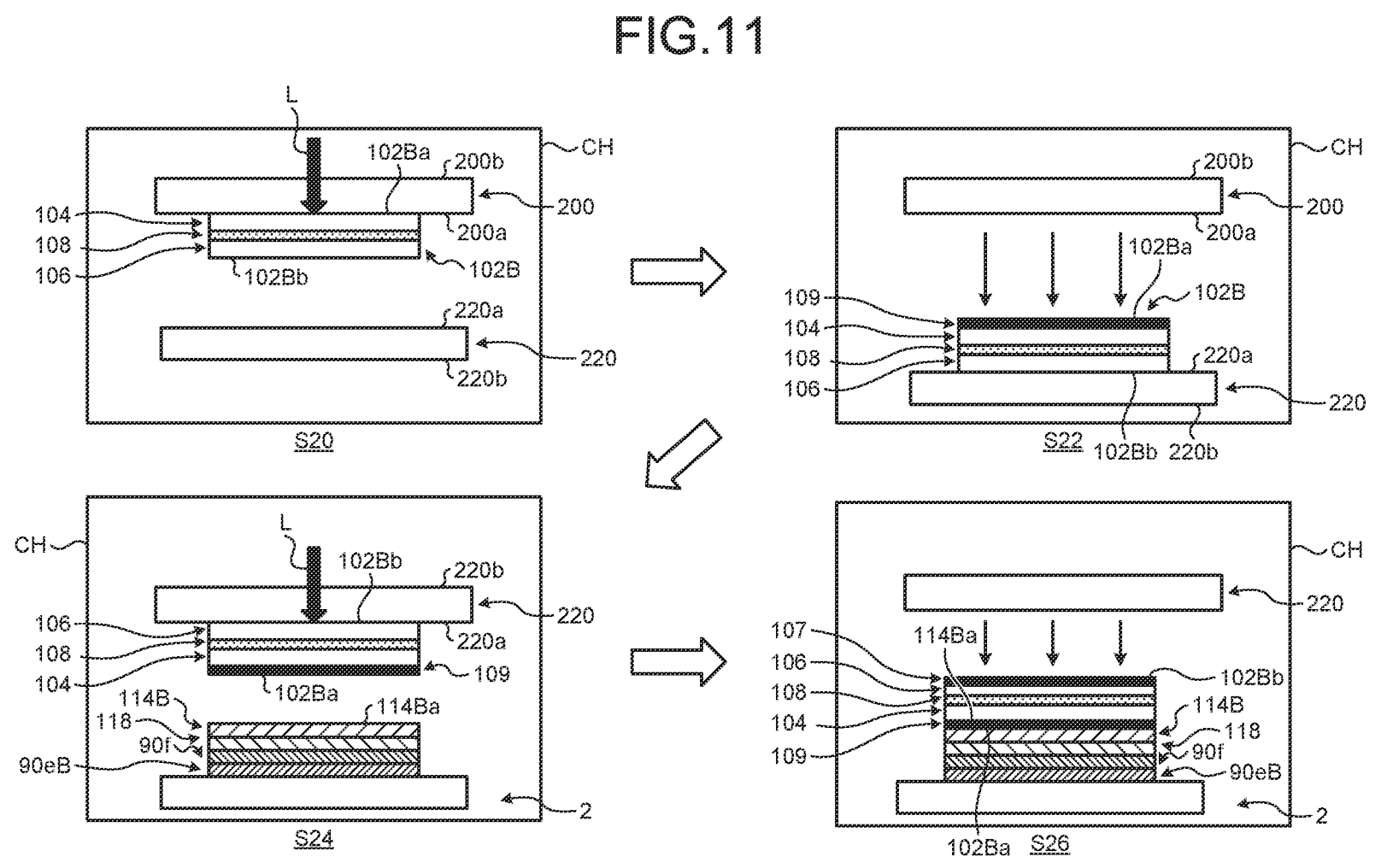

The light emitter 100B has the above-mentioned configuration. Next, a method for manufacturing the light emitter 100B will be described. FIG. 11 is a view for explaining a lamination method of the light emitter in the second embodiment. When the light emitter 100B is laminated, the surface 200a of the formation substrate 200 on which the light emitting element 102B has been formed is made to face a surface 220a of the transfer substrate 220 and the laser light L is emitted to the light emitting element 102B in the chamber CH, as indicated at step S20 in FIG. 11. The transfer substrate 220 may be made of a desired material and may be, for example, poly dimethylsiloxane (PDMS) or silicon oxide (SiO$_2$). When silicon oxide is used, a viscous agent is preferably provided on the surface thereof.

At step S20, the laser light L is emitted to a surface 102Ba of the light emitting element 102B in this state, that is, the state where the surface 200a of the formation substrate 200 and the surface 220a of the transfer substrate 220 face each other in the chamber CH. To be specific, the laser light L is emitted to the formation substrate 200 from the surface 200b side of the formation substrate 200. The laser light L enters the inside of the formation substrate 200 from the surface 200b, reaches the surface 200a, and is emitted to the surface 102Ba of the light emitting element 102B that contacts the surface 200a. The light emitting element 102B is thus irradiated with the laser light L to be separated (stripped off) from the formation substrate 200 as indicated at step S22. That is to say, the light emitting element 102B is stripped off from the formation substrate 200 by laser lift-off at step S20 and step S22 (separation step). The surface 102Ba of the light emitting element 102B (n-type clad layer 104) to which the laser light L has been emitted is oxidized, so that the oxide layer 109 is formed on the surface 102Ba, as indicated at step S22.

When the light emitting element 102B is stripped off from the formation substrate 200, the surface 220a of the transfer substrate 220 faces the surface 200a of the formation substrate 200. Accordingly, the light emitting element 102B stripped off from the formation substrate 200 is transferred onto the surface 220a of the transfer substrate 220 as indicated at step S22. More specifically, the surface 102b of the light emitting element 102B contacts the surface 220a of the transfer substrate 220, and the surface 102Ba of the light emitting element 102B (p-type clad layer 106) and the surface 220a of the transfer substrate 220 are joined to each other.

After the light emitting element 102B is transferred onto the transfer substrate 220, the surface 220a of the transfer substrate 220 on which the light emitting element 102B has been formed is made to face the surface of the array substrate 2 and the laser light L is emitted to the light emitting element 102B in the chamber CH, as indicated at step S24. The counter cathode electrode 90eB, the coupling layer 90f, the reflective layer 118, and the cathode electrode 114B are stacked on the surface of the array substrate 2 that faces the transfer substrate 220, and the layers formed under the light emitting element 102B, such as the transistors Tr, are further stacked thereon. Accordingly, the surface 102Ba of the light emitting element 102B and a surface 114Ba of the cathode electrode 114B face each other.

The laser light L is emitted to a surface 102Bb of the light emitting element 102B in this state, that is, the state where the surface 220a of the transfer substrate 220 and the surface of the array substrate 2 face each other in the chamber CH. To be specific, the laser light L is emitted to the transfer substrate 220 from a surface 220b side of the transfer substrate 220. The laser light L enters the inside of the transfer substrate 220 from the surface 220b, reaches the surface 220a, and is emitted to the surface 102Bb of the light emitting element 102B that contacts the surface 220a. The light emitting element 102B is thus irradiated with the laser light L to be separated (stripped off) from the transfer substrate 220 as indicated at step S26. The laser light L that is emitted at step S24 is preferably set to have a wavelength range where it passes through the transfer substrate 220 and does not pass through the p-type clad layer 106 of the light emitting element 102B.

The oxygen concentration is high in the chamber CH in which the light emitting element 102B has been stripped off by emission of the laser light L similarly to the first embodiment. Accordingly, the surface 102Bb of the light emitting element 102B (p-type clad layer 106) to which the laser light L has been emitted is oxidized, so that the oxide layer 107 is formed on the surface 102Bb, as indicated at step S26.

When the light emitting element 102B is stripped off from the transfer substrate 220, the surface of the array substrate 2 faces the surface 220a of the transfer substrate 220. Accordingly, the light emitting element 102B stripped off from the transfer substrate 220 is stacked above the surface of the array substrate 2 as indicated at step S26. More specifically, the surface 102Ba of the light emitting element 102 contacts the surface of the array substrate 2, in this example, the surface 114Ba of the cathode electrode 114B, and the surface 102Bb of the light emitting element 102B and the surface 110Ba of the anode electrode 110 are joined to each other. That is to say, the light emitting element 102B is transferred onto the array substrate 2 from the transfer substrate 220. Thereafter, the anode electrode 110B is stacked above the light emitting element 102B, thereby forming the light emitter 100B. The counter anode electrode 50eB is partially formed above the anode electrodes 110B, so that the display device 1B is formed.

Although only the light emitting element 102 is formed above the formation substrate 200 and the transfer substrate 220 at steps S20 and S22 in the second embodiment, members of the light emitter 100 other than the light emitting element 102 may be formed. For example, at least one of the coupling layer 90f, the reflective layer 118, the coupling layer 116, the cathode electrode 114B, the coupling layer 110B1, and the anode electrode 110B may be formed above at least one of the formation substrate 200 and the transfer substrate 220 together with the light emitting element 102B and be transferred onto the array substrate 2.

As described above, in the method for manufacturing the light emitter 100B in the second embodiment, the light emitting element 102B is transferred onto the transfer substrate 220 from the formation substrate 200 such that the surface 102Bb (second surface in the embodiment) of the light emitting element 102B contacts the surface 220a of the transfer substrate 220 by emitting the laser light L to the light emitting element 102B in the state where the surface 200a of the formation substrate 200 is made to face the surface 220a of the transfer substrate 220 (first separation step). The oxide layer 109 is thereby formed on the surface 102Ba (first surface in the embodiment) of the light emitting element 102B on the formation substrate 200 side. In the method for manufacturing the light emitter 100B in the second embodiment, the light emitting element 102B transferred onto the surface 220a of the transfer substrate 220 is separated from the surface 220a of the transfer substrate 220 and is transferred onto the array substrate 2 (second separation step). By manufacturing the light emitting bodies 100B as in the second embodiment, the oxide layers 109 can be formed to prevent the light emitting performance from being lowered. Transfer of the light emitting elements 102B onto the transfer substrate 220 enables selection of the light emitting elements 102B with good quality, predetermined emission colors, or the like and transfer of them onto the transfer substrate 220. With the selection and transfer, the necessity of selection of the light emitting elements 102B to be transferred is eliminated when they are transferred onto the array substrate 2 from the transfer substrate 220, thereby preventing the transfer process onto the array substrate 2 from being complicated.

In the method for manufacturing the light emitter 100B in the second embodiment, the light emitting element 102B is transferred onto the array substrate 2 from the transfer substrate 220 such that the surface 102Ba of the light emitting element 102B contacts the surface of the array substrate 2 (the surface 114Ba of the cathode electrode 114B in the embodiment) and the oxide layer 107 is formed on the surface 102Bb of the light emitting element 102B by emitting the laser light L to the light emitting element 102B in the state where the surface 220a of the transfer substrate 220 is made to face the surface of the array substrate 2. This manufacturing method can appropriately prevent the light emitting efficiency from being lowered by providing the oxide layers on both surfaces of the light emitting element 102B.

Figure 12:
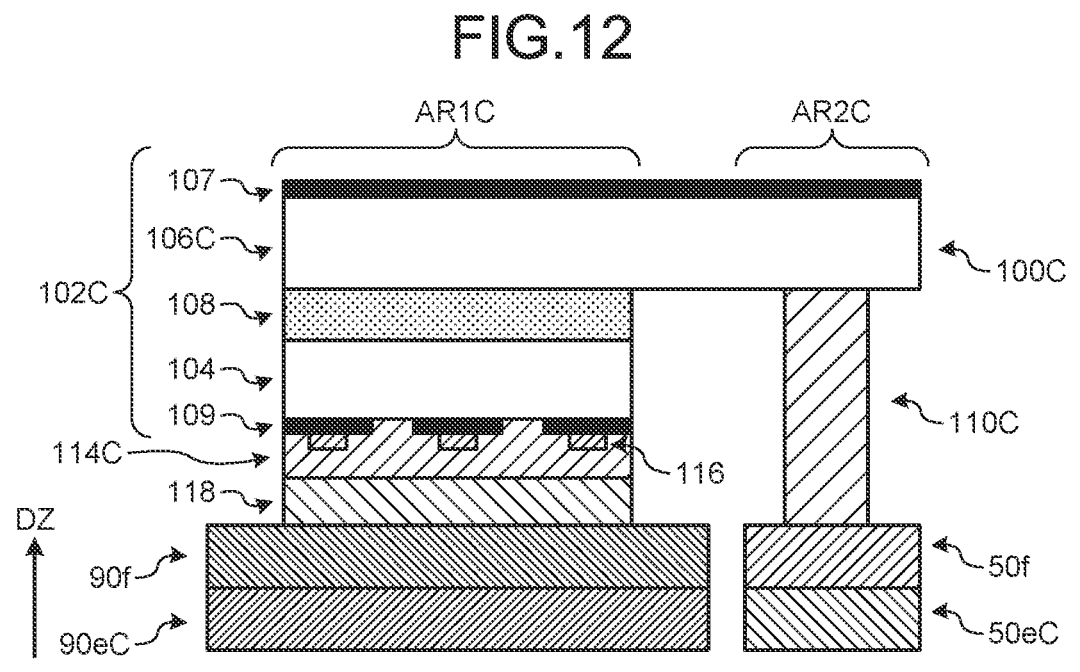

Although description has been made while employing the face-up type as the example also in the second embodiment, the face-down type may be employed. FIG. 12 is a view illustrating a light emitter in another example of the second embodiment. As illustrated in FIG. 12, a light emitter 100C in another example of the second embodiment is of the face-down type. A p-type clad layer 106C of a light emitting element 102C is configured to have an area larger than those of the n-type clad layer 104 and the light emitting layer 108 in plan view. The light emitter 100C has a region AR1C in which the p-type clad layer 106C is superimposed on the n-type clad layer 104 and the light emitting layer 108 and a region AR2C in which the p-type clad layer 106C is not superimposed on the n-type clad layer 104 and the light emitting layer 108. In the region AR1C, the light emitter 100C is configured by stacking a counter cathode electrode 90eC, the coupling layer 90f, the reflective layer 118, a cathode electrode 114C, the oxide layer 109, the n-type clad layer 104, the light emitting layer 108, the p-type clad layer 106C, and the oxide layer 107 in this order toward the upper side. On the other hand, in the region AR2C, the light emitter 100C is configured by stacking a counter anode electrode 50eC, the coupling layer 50f, an anode electrode 110C, the p-type clad layer 106C, and the oxide layer 107 in this order toward the upper side. The anode electrode 110C need not have translucency unlike the anode electrode 110B illustrated in FIG. 10, and it is sufficient that the anode electrode 110C is made of a material having conductivity. For example, the anode electrode 110C contains titanium (Ti) and aluminum (Al), and a titanium layer, an aluminum layer, and a titanium layer are stacked along the third direction Dz. In the case of the face-down type, the oxide layer 107 on the upper side may have no through-hole. The counter cathode electrode 90eC and the counter anode electrode 50eC are made of similar materials and have similar shapes to those of the counter cathode electrode 90eB and the counter anode electrode 50eB, respectively.

Figure 13:
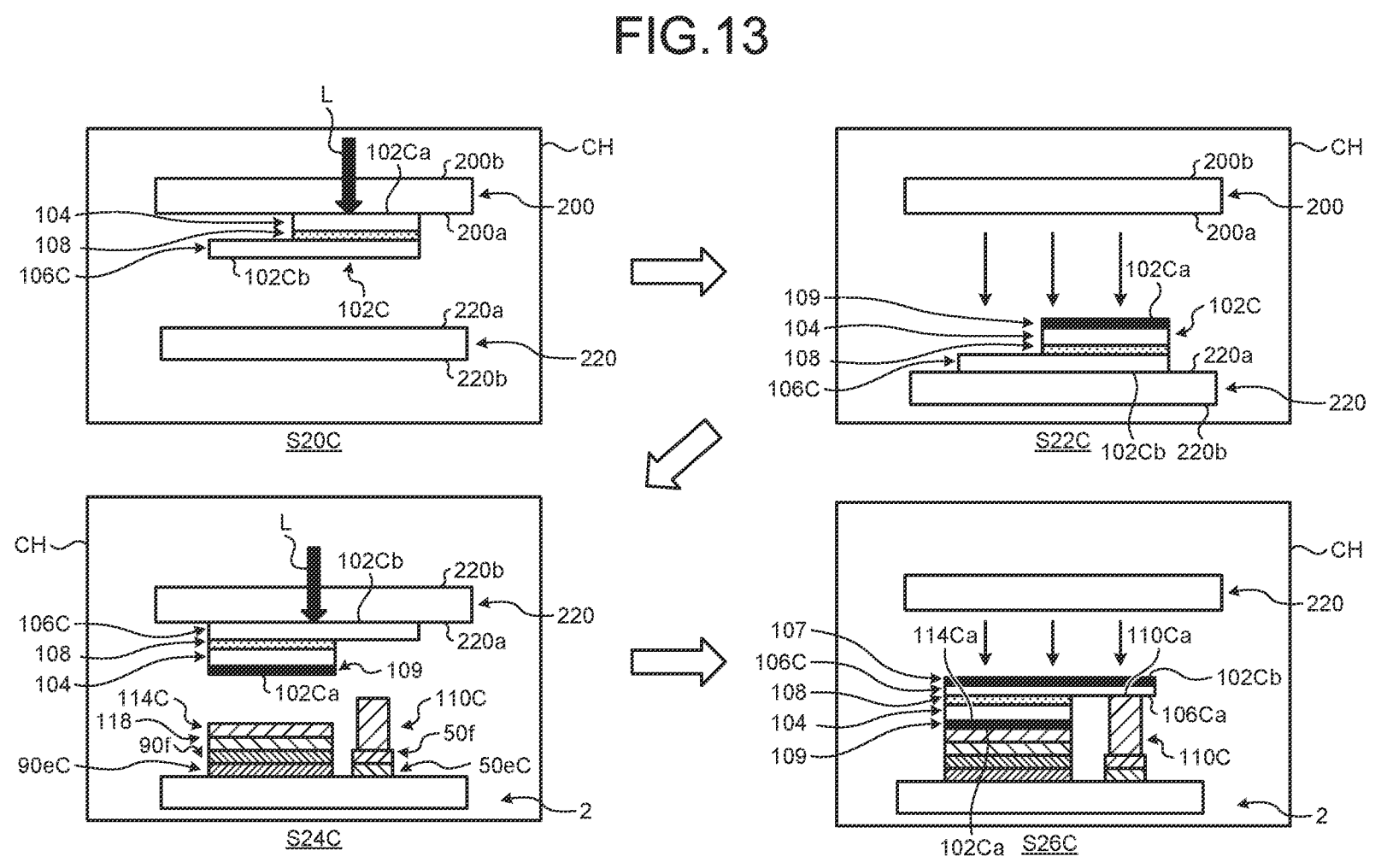

FIG. 13 is a view for explaining a lamination method of the light emitter in another example of the second embodiment. When the light emitter 100C of the face-down type as illustrated in FIG. 12 is manufactured, steps S20C, S22C, S24C, and S26C are executed as illustrated in FIG. 13. Steps S20C, S22C, S24C, and S26C are similar processes to S20, S22, S24, and S26 in FIG. 11 other than the shape of the light emitter 100B and the layers above the array substrate 2, and detail explanation thereof is therefore omitted. As indicated at steps S20C and S22C, for example, the laser light L is emitted to the light emitting element 102C above the formation substrate 200 to form the oxide layer 109 and transfer the light emitting element 102C onto the transfer substrate 220 in the chamber CH. Then, as indicated at steps S24C and S26C, the laser light L is emitted to the light emitting element 102C above the transfer substrate 220 to form the oxide layer 107 and transfer the light emitting element 102C onto the array substrate 2 in the chamber CH. The counter anode electrode 50eC, the coupling layer 50f, and the anode electrode 110C are formed on the array substrate 2 at step S24C. As indicated at step S26C, the counter anode electrode 50eC is formed above the substrate 10. The coupling layer 110B1 to the oxide layer 107 and the contact hole H1 illustrated in FIG. 3 are not therefore necessary. The counter anode electrode 50eC receives supply of the anode power supply potential PVDD via wiring formed above the substrate 10 similarly to the counter cathode electrode 90e.

In the second embodiment, the n-type clad layer 104 of the p-type clad layer 106 and the n-type clad layer 104 is arranged on the lower side above the array substrate 2. They are not, however, limited to being arranged in this manner, and the p-type clad layer 106 may be arranged on the lower side. In this case, for example, it is sufficient that the light emitting element is transferred onto another transfer substrate from the transfer substrate 220, and then, it is transferred onto the array substrate 2 from the other transfer substrate.

Third Embodiment

Next, a third embodiment is described. The laser light L is used for both of the transfer onto the transfer substrate 220 from the formation substrate 200 and the transfer onto the array substrate 2 from the transfer substrate 220 in the second embodiment. Alternatively, the laser light L is used for only one transfer in the third embodiment. A light emitter 100D in the third embodiment includes an oxide layer on only one surface. Description of configurations and processes in the third embodiment that are common to those in the second embodiment is omitted.

Figure 14:
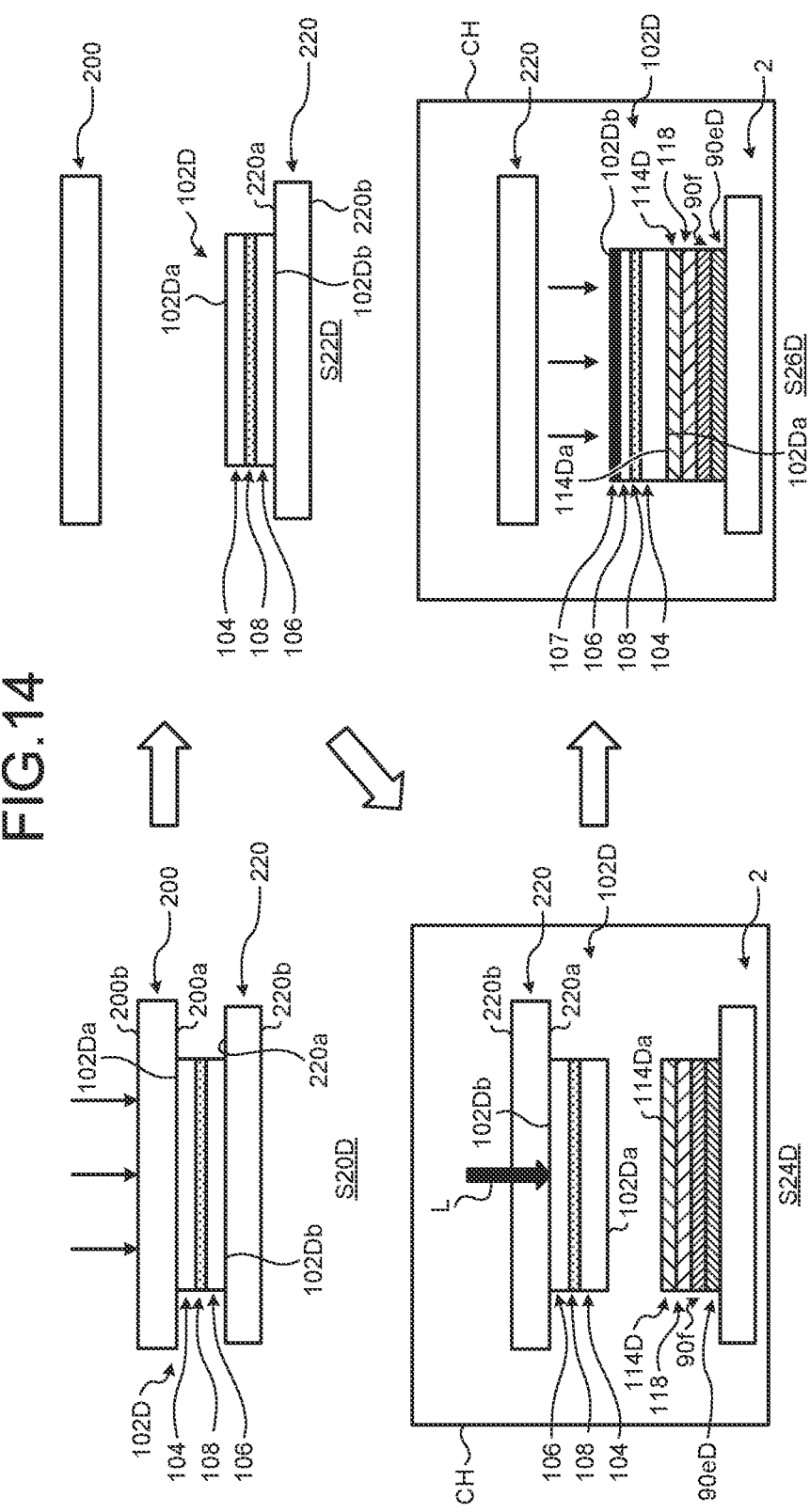
FIG. 14 is a view for explaining a lamination method of a light emitter according to a third embodiment.

First, the case in which the laser light L is not used for the transfer onto the transfer substrate 220 from the formation substrate 200 and the laser light L is used for the transfer onto the transfer substrate 220 from the formation substrate 200 is described. FIG. 14 is a view for explaining a lamination method of the light emitter in the third embodiment.

A surface 102Db of a light emitting element 102D formed above the formation substrate 200 is pressurized while being in contact with the surface 220a of the transfer substrate 220 as indicated at step S20D in FIG. 14. That is to say, load is applied in a direction in which the surface 102Db of the light emitting element 102D and the surface 220a of the transfer substrate 220 press against each other in a state where the surface 102b of the light emitting element 102D is in contact with the surface 220a of the transfer substrate 220. The surface 102Db of the light emitting element 102D may be heated while being pressurized. The surface 102Db of the light emitting element 102D is thereby joined to the surface 220a of the transfer substrate 220 as indicated at step S22D, and a joint force between the light emitting element 102D and the transfer substrate 220 is made larger than a joint force between the light emitting element 102D and the formation substrate 200. Accordingly, when the formation substrate 200 is away from the transfer substrate 220 by releasing the pressurization, the light emitting element 102D is separated (stripped off) from the formation substrates 200, and the light emitting element 102D is transferred onto the transfer substrate 220, as indicated at step S22D.

In this case, no oxide layer is formed on a surface 102Da of the light emitting element 102D. When the light emitting element 102D is transferred onto the transfer substrate 220 without using the laser light L, no laser light L is emitted to the surface 102a and the surface 102Da of the light emitting element 102D is therefore less possibly deteriorated. For this reason, the oxide layer need not be formed.

Steps S24D and S26D after step S22D are similar to step S24 and S26 in FIG. 11, and detail explanation thereof is therefore omitted. For example, at steps S24D and S26D, the laser light L is emitted to the light emitting element 102D transferred onto the transfer substrate 220 to form the oxide layer 107 on the surface 102b of the light emitting element 102D and transfer the light emitting element 102D onto the array substrate 2, thereby manufacturing the light emitter 100D.

Figure 15:
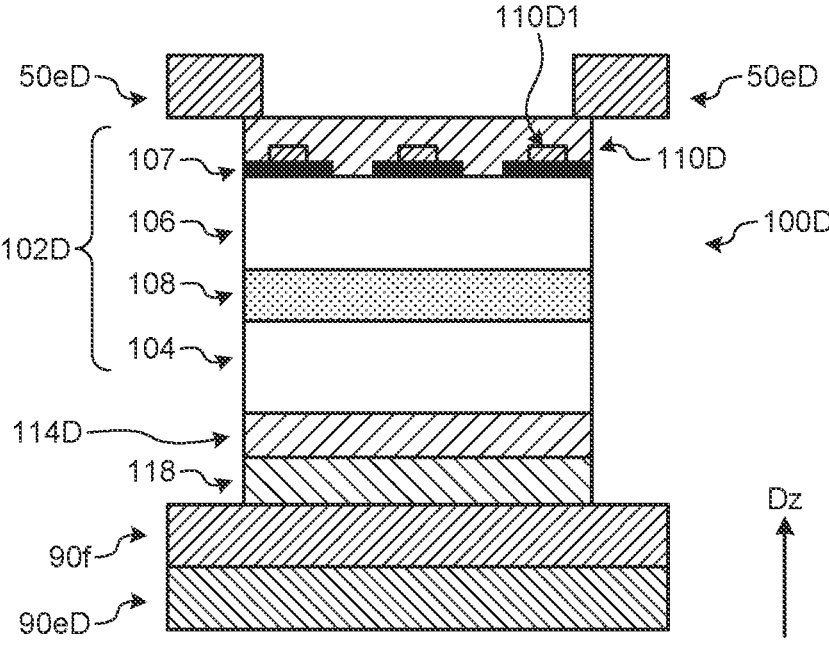
FIG. 15 is a cross-sectional view illustrating an example of the configuration of the light emitter according to the third embodiment.

FIG. 15 is a cross-sectional view illustrating an example of the configuration of the light emitter in the third embodiment. As illustrated in FIG. 15, no oxide layer is provided under the light emitting layer 108 because the light emitter 100D in the third embodiment is manufactured as illustrated in FIG. 14. That is to say, the light emitter 100D is configured by stacking a counter cathode electrode 90eD, the coupling layer 90f, the reflective layer 118, a cathode electrode 114D, the n-type clad layer 104, the light emitting layer 108, the p-type clad layer 106, the oxide layer 107, an anode electrode 110D, and a counter anode electrode 50eD in this order toward the upper side. A coupling layer 110D1 is provided on the anode electrode 110D. The cathode electrode 114D may include no coupling layer because no oxide layer is provided under the n-type clad layer 104. Other configurations thereof are similar to those of the light emitter 100B in the second embodiment illustrated in FIG. 10. For example, the counter cathode electrode 90eD, the anode electrode 110D, and the counter anode electrode 50eD are made of similar materials and have similar shapes to those of the counter cathode electrode 90eB, the anode electrode 110B, and the counter anode electrode 50eB, respectively.

The transfer onto the transfer substrate 220 from the formation substrate 200 is performed by the pressurization in the third embodiment. A transfer method is, however, not limited thereto as long as the method uses no laser light L. For example, the following fluid transfer may be performed. That is, the formation substrate 200 and the transfer substrate 220 are arranged in a fluid, the fluid is made to flow from the formation substrate 200 to the transfer substrate 220, the light emitting element 102D is separated from the formation substrate 200 by flow of the fluid, and the light emitting element 102D is made to flow toward the transfer substrate 220 to be transferred onto the transfer substrate 220.

Figure 16:
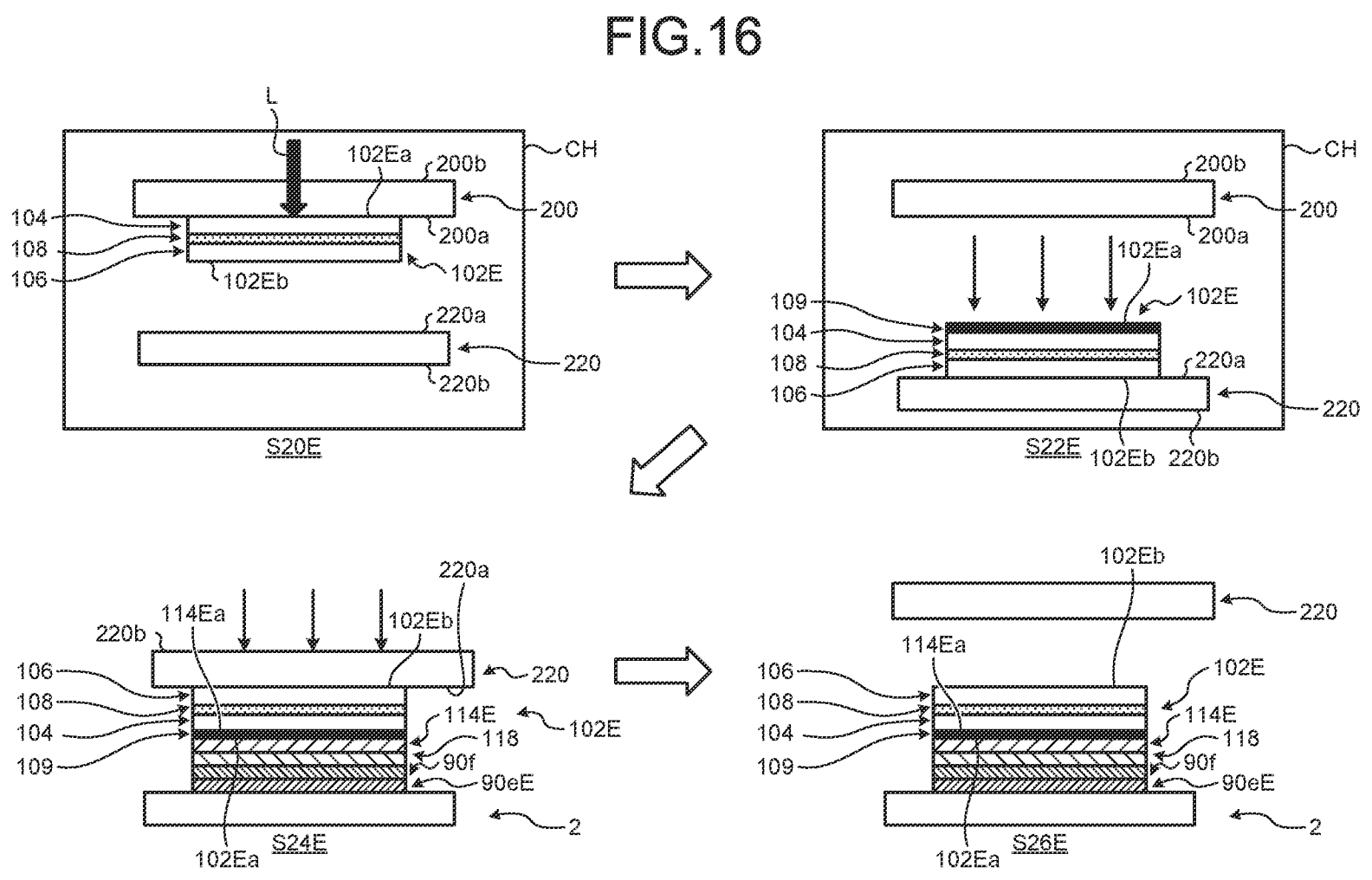

Then, the case in which the laser light L is used for the transfer onto the transfer substrate 220 from the formation substrate 200 and the laser light L is not used for the transfer onto the transfer substrate 220 from the formation substrate 200 is described. FIG. 16 is a view for explaining a lamination method of a light emitter in another example of the third embodiment.

Steps S20E and S22E in FIG. 16 are similar to steps S20 and S22 in FIG. 11, and detail explanation thereof is therefore omitted. For example, at steps S20E and S22E, the laser light L is emitted to a light emitting element 102E formed on the formation substrate 200 to form the oxide layer 109 on a surface 102Ea of the light emitting element 102E and transfer the light emitting element 102E onto the transfer substrate 220.

The surface 102Ea of the light emitting element 102E transferred onto the transfer substrate 220 is pressurized while being in contact with the surface of the array substrate 2, in this example, a surface 114Ea of a cathode electrode 114E as indicated at step S24E. That is to say, load is applied in a direction in which the surface 102Ea of the light emitting element 102E and the surface 114Ea of the cathode electrode 114E press against each other in a state where the surface 102Ea of the light emitting element 102E is in contact with the surface 114Ea of the cathode electrode 114E. The surface 102Ea of the light emitting element 102E may be heated while being pressurized. The surface 102Ea of the light emitting element 102E is thereby joined to the surface 114Ea of the cathode electrode 114E as indicated at step S24E, and a joint force between the light emitting element 102E and the array substrate 2 is made larger than a joint force between the light emitting element 102E and the transfer substrate 220. Accordingly, when the transfer substrate 220 is away from the array substrate 2 by releasing the pressurization, the light emitting element 102E is separated (stripped off) from the transfer substrates 220, and the light emitting element 102E is transferred onto the array substrate 2, as indicated at step S26E. In this case, no oxide layer is formed on a surface 102Eb of the light emitting element 102E.

Even in this case, a transfer method is, however, not limited to the pressurization as long as the method uses no laser light L. For example, the following fluid transfer may be performed. That is, the transfer substrate 220 and the array substrate 2 are arranged in a fluid, the fluid is made to flow from the transfer substrate 220 to the array substrate 2, the light emitting element 102E is separated from the transfer substrate 220 by flow of the fluid, and the light emitting element 102E is made to flow toward the array substrate 2 to be transferred onto the array substrate 2.

Figure 17:
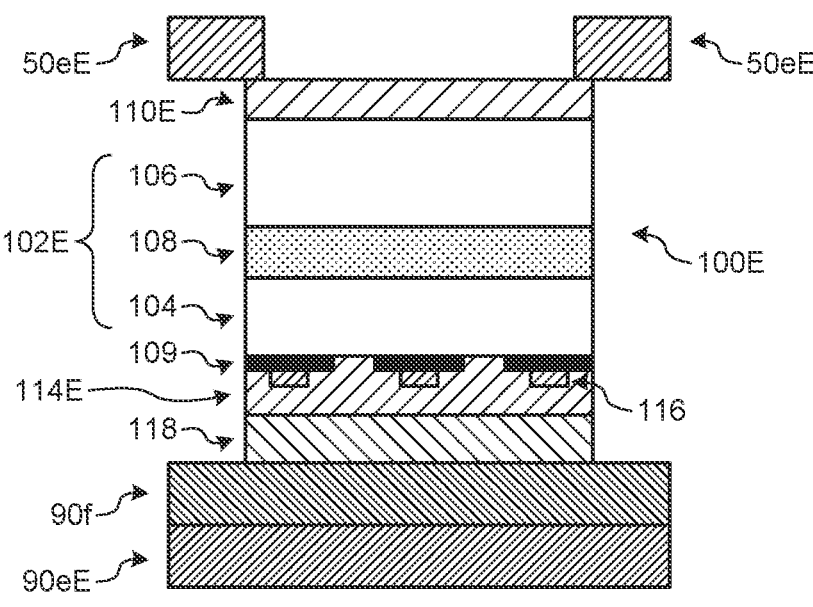
FIG. 17 is a cross-sectional view illustrating an example of the configuration of the light emitter in another example of the third embodiment.

FIG. 17 is a cross-sectional view illustrating an example of the configuration of the light emitter in another example of the third embodiment. As illustrated in FIG. 17, a light emitter 100E is manufactured as illustrated in FIG. 16, and no oxide layer on the upper side is therefore provided. That is to say, the light emitter 100E is configured by stacking a counter cathode electrode 90eE, the coupling layer 90f, the reflective layer 118, the cathode electrode 114E, the oxide layer 109, the n-type clad layer 104, the light emitting layer 108, the p-type clad layer 106, an anode electrode 110E, and a counter anode electrode 50eE in this order toward the upper side. The coupling layer 116 is provided on the cathode electrode 114E. The anode electrode 110E may include no coupling layer because no oxide layer is provided above the p-type clad layer 106. Other configurations thereof are similar to those of the light emitter 100B in the second embodiment illustrated in FIG. 10. For example, the counter cathode electrode 90eE, the cathode electrode 114E, and the counter anode electrode 50eE are made of similar materials and have similar shapes to those of the counter cathode electrode 90eB, the cathode electrode 114B, and the counter anode electrode 50eB, respectively.

As described above, in the method for manufacturing the light emitter 100E in the embodiment, the light emitting element 102E is transferred onto the array substrate 2 from the transfer substrates 220 by pressurizing the surface 102Ea (first surface in this example) of the light emitting element 102E above the transfer substrate 220 while making it contact with the surface of the array substrate 2 (second separation step). The light emitting performance can be prevented from being lowered by performing the transfer with the laser light L and the transfer by the pressurization (stamp transfer) and providing the oxide layer on the surface irradiated with the laser light L as described above.

In the method for manufacturing the light emitter 100D in the embodiment, the light emitting element 102D is transferred onto the transfer substrate 220 from the formation substrates 200 such that the surface 102Db (first surface in this example) of the light emitting element 102D formed above the formation substrate 200 makes contact with the surface 220a of the transfer substrate 220 by pressurizing the surface 102Db of the light emitting element 102D while making it contact with the surface 220a of the transfer substrate 220 (arrangement step). The light emitting element 102D is transferred onto the array substrate 2 from the transfer substrate 220 such that the surface 102Da (second surface in this example) of the light emitting element 102D contacts the surface of the array substrate 2 by emitting the laser light L to the light emitting element 102D in the state where the surface 220a of the transfer substrate 220 is made to face the surface of the array substrate 2. The light emitting performance can be prevented from being lowered by performing the transfer with the laser light L and the transfer by the pressurization (stamp transfer) and providing the oxide layer on the surface irradiated with the laser light L, as described above.

Other action effects provided by the aspect described in the embodiments that are obvious from description of the present specification or at which those skilled in the art can appropriately arrive should be interpreted to be provided by the present disclose.

What is claimed is:

1. A method for manufacturing an inorganic light emitter, the method comprising:

arranging an inorganic light emitting element comprising an n-type clad layer on one surface of a substrate;

separating the inorganic light emitting element from the substrate while forming an oxide layer on a first surface of the inorganic light emitting element by emitting laser light to the first surface under an atmosphere having an oxygen concentration higher than an oxygen concentration of air, the first surface contacting the one surface of the substrate;

stacking the inorganic light emitting element separated at the separating on an array substrate to manufacture the inorganic light emitter;

forming a conductive coupling layer; and forming a cathode electrode that is coupled to the n-type clad layer that is under the oxide layer, the cathode electrode extends through a plurality of through-holes penetrating the oxide layer, wherein the conductive coupling layer is a different material than the cathode electrode, the cathode electrode directly contacts the n-type clad layer and the conductive coupling layer, the oxide layer, the conductive coupling layer, and the cathode electrode are layered in this order on the first surface of the inorganic light emitting element, and the conductive coupling layer is a different material than the oxide layer.

2. The method for manufacturing the inorganic light emitter according to claim 1, wherein the oxygen concentration is set to be in a range of 22% to 30% at the separating.

3. The method for manufacturing the inorganic light emitter according to claim 1, wherein the arranging includes forming the inorganic light emitting element above a formation substrate, and the separating includes separating the inorganic light emitting element from the formation substrate by emitting the laser light to the inorganic light emitting element above the formation substrate.

4. The method for manufacturing the inorganic light emitter according to claim 3, wherein the separating includes transferring the inorganic light emitting element onto the array substrate from the formation substrate such that a second surface of the inorganic light emitting element on an opposite side to the first surface makes contact with a surface of the array substrate, by emitting the laser light to the inorganic light emitting element in a state where the one surface of the formation substrate is made to face the surface of the array substrate.

5. The method for manufacturing the inorganic light emitter according to claim 3, wherein the separating includes first separating of transferring the inorganic light emitting element onto a transfer substrate from the formation substrate such that a second surface of the inorganic light emitting element on an opposite side to the first surface makes contact with a surface of the transfer substrate, by emitting the laser light to the inorganic light emitting element in a state where the one surface of the formation substrate is made to face the surface of the transfer substrate; and second separating of separating the inorganic light emitting element transferred onto the surface of the transfer substrate from the surface of the transfer substrate and transferring the inorganic light emitting element onto the array substrate.

6. The method for manufacturing the inorganic light emitter according to claim 5, wherein the second separating includes transferring the inorganic light emitting element onto the array substrate from the transfer substrate such that the first surface of the inorganic light emitting element makes contact with a surface of the array substrate, while forming a second oxide layer on the second surface of the inorganic light emitting element, by emitting the laser light to the inorganic light emitting element in a state where the surface of the transfer substrate is made to face the surface of the array substrate.

7. The method for manufacturing the inorganic light emitter according to claim 5, wherein the second separating includes transferring the inorganic light emitting element onto the array substrate from the transfer substrate by pressurizing the first surface of the inorganic light emitting element above the transfer substrate while making the first surface contact with a surface of the array substrate.

8. The method for manufacturing the inorganic light emitter according to claim 3, wherein the inorganic light emitting element is configured by stacking, above the formation substrate, the n-type clad layer, a light emitting layer, and a p-type clad layer in this order from a side of a surface of the formation substrate.

9. The method for manufacturing the inorganic light emitter according to claim 1, wherein the conductive coupling layer includes at least one of titanium and tin between the oxide layer of the light emitting element and an electrode provided above the array substrate.

10. The method for manufacturing the inorganic light emitter according to claim 1, wherein the conductive coupling layer is provided between the oxide layer and a lower surface of the cathode electrode.

11. The method for manufacturing the inorganic light emitter according to claim 1, wherein the cathode electrode is coupled to the n-type clad layer through the plurality of through-holes.

12. The method for manufacturing the inorganic light emitter according to claim 1, wherein the conductive coupling layer is provided under a lower surface of the cathode electrode without overlapping the through-holes of the oxide layer.

13. The method for manufacturing the inorganic light emitter according to claim 1, wherein the conductive coupling layer includes a first member that is a tin layer and a second members that are made of titanium, and the second members are dotted in the first member.

\* \* \* \* \*